(12) United States Patent
Nishimura et al.

(10) Patent No.: US 7,510,972 B2
(45) Date of Patent: Mar. 31, 2009

(54) METHOD OF PROCESSING SUBSTRATE, POST-CHEMICAL MECHANICAL POLISHING CLEANING METHOD, AND METHOD OF AND PROGRAM FOR MANUFACTURING ELECTRONIC DEVICE

(75) Inventors: Eiichi Nishimura, Nirasaki (JP); Kenya Iwasaki, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 454 days.

(21) Appl. No.: 11/353,154

(22) Filed: Feb. 14, 2006

(65) Prior Publication Data

US 2006/0189138 A1    Aug. 24, 2006

Related U.S. Application Data

(60) Provisional application No. 60/655,892, filed on Feb. 25, 2005.

(30) Foreign Application Priority Data

Feb. 14, 2005  (JP)  ............... 2005-036717
Sep. 26, 2005  (JP)  ............... 2005-278841

(51) Int. Cl.
  *H01L 21/302*  (2006.01)
  *G06F 17/50*  (2006.01)
(52) U.S. Cl. ............. 438/690; 438/625; 438/626; 438/631; 438/633; 438/691; 438/692; 438/697; 438/723; 438/738; 438/743; 257/E21.243; 257/E21.244; 257/E21.245; 257/E21.303; 257/E21.304; 257/E21.58; 257/E21.583; 716/21

(58) Field of Classification Search ............... 438/625, 438/626, 631, 633, 690, 691, 692, 697, 723, 438/738, 743; 257/E21.243, E21.244, E21.245, 257/E21.303, E21.304, E21.58, E21.583; 716/21
See application file for complete search history.

(56) References Cited

U.S. PATENT DOCUMENTS

| | | | |
|---|---|---|---|
| 5,685,951 A | 11/1997 | Torek et al. | |
| 5,830,280 A | 11/1998 | Sato et al. | |
| 5,990,019 A * | 11/1999 | Torek et al. | ............ 438/723 |
| 6,541,351 B1 | 4/2003 | Bartlau et al. | |
| 6,656,824 B1 | 12/2003 | Hanafi et al. | |
| 6,660,598 B2 | 12/2003 | Hanafi et al. | |
| 6,790,733 B1 * | 9/2004 | Natzle et al. | ............ 438/300 |
| 2001/0045651 A1 * | 11/2001 | Saito et al. | ............ 257/750 |
| 2004/0147127 A1 * | 7/2004 | Noguchi et al. | ............ 438/690 |
| 2004/0182417 A1 | 9/2004 | Hamelin et al. | |
| 2004/0184792 A1 | 9/2004 | Hamelin et al. | |

(Continued)

FOREIGN PATENT DOCUMENTS

JP    9-251969    9/1997

*Primary Examiner*—Thanh V Pham
(74) *Attorney, Agent, or Firm*—Oblon, Spivak, McClelland, Maier & Neustadt, P.C.

(57) ABSTRACT

A method of processing a substrate which enables a surface damaged layer and polishing remnants on the surface of an insulating film to be removed, and enable the amount removed of the surface damaged layer and polishing remnants to be controlled easily. An insulating film on a substrate, which has been revealed by chemical mechanical polishing, is exposed to an atmosphere of a mixed gas containing ammonia and hydrogen fluoride under a predetermined pressure. The insulating film which has been exposed to the atmosphere of the mixed gas is heated to a predetermined temperature.

18 Claims, 11 Drawing Sheets

U.S. PATENT DOCUMENTS

2004/0185583 A1 9/2004 Tomoyasu et al.
2004/0185670 A1 9/2004 Hamelin et al.
2004/0241981 A1 12/2004 Doris et al.
2004/0248409 A1* 12/2004 Padhi et al. ................. 438/653

* cited by examiner

METHOD OF PROCESSING SUBSTRATE, POST-CHEMICAL MECHANICAL POLISHING CLEANING METHOD, AND METHOD OF AND PROGRAM FOR MANUFACTURING ELECTRONIC DEVICE

BACKGROUND OF THE INVENTION

1. Field of the Invention

The present invention relates to a method of processing a substrate, a post-chemical mechanical polishing cleaning method, and a method of and program for manufacturing an electronic device, and in particular relates to a method of manufacturing an electronic device according to which the flatness of a surface is improved by carrying out plasma-less etching after polishing a conductive film formed on the surface by chemical mechanical polishing.

2. Description of the Related Art

In a method of manufacturing an electronic device in which an electronic device is manufactured from a silicon wafer (hereinafter referred to merely as a "wafer"), a lithography step of forming a photoresist layer in a desired pattern on an insulating film that has been formed on a surface of the wafer, an etching step of fabricating a conductive film into gate electrodes, or fabricating wiring grooves or contact holes in the insulating film, with plasma using the photoresist layer as a mask, a film formation step of using PVD (physical vapor deposition) or the like to form a conductive film on the surface of the insulating film in which the wiring grooves or contact holes have been fabricated, and a flattening step (etch back step) of removing the formed conductive film, thus revealing the insulating film, and flattening the surface of the revealed insulating film are repeatedly implemented in this order.

In recent years, in the flattening step, a wafer surface polishing method known as CMP (chemical mechanical polishing) has come to be used instead of conventionally used dry etching or thermal reflow. In CMP, as shown in FIG. 11, the wafer is pushed against a rotating table 201 having a polishing cloth 200 made of polyurethane or the like stuck thereon by a head (wafer holding portion) 202 such that a surface of the wafer comes into close contact with the polishing cloth 200, a polishing agent (slurry) having silica ($SiO_2$) as a principal component thereof is supplied onto the polishing cloth 200 from a slurry supply nozzle 203, and a cleaning liquid is supplied, and at the same time the rotating table 201 and the head 202 are rotated independently to one another, thus polishing the surface of the wafer. In CMP, it is thought that the polishing is promoted through a synergistic effect between physical contact between $SiO_2$ particles in the polishing agent and a conductive film or insulating film on the wafer surface, and chemical reaction between the $SiO_2$ particles and the conductive film or insulating film (see, for example, Japanese Laid-open Patent Publication (Kokai) No. H9-251969.

Moreover, in recent years, to prevent a decrease in signal transmission speed due to the high dielectric constant of interlayer insulating films, which has become a conspicuous problem as the wiring rule (required dimension) for electronic devices has been made smaller, low relative dielectric constant (low-κ) materials (see Table 1) have come to be used as interlayer insulating film materials. In particular, because copper is widely used as a wiring material, recently carbon-doped SiOC type low dielectric constant materials have come to be used as low dielectric constant interlayer insulating film materials. Moreover, the use of porous materials having a yet lower dielectric constant has also been investigated. Here, a relative dielectric constant of not more than 3.0 is referred to as a "low dielectric constant".

TABLE 1

| Interlayer insulating film | Relative dielectric constant | Structure |
|---|---|---|
| Inorganic | | |
| HSQ | 3 to 2.8 | $\left[\begin{array}{cc} H & H \\ | & | \\ -Si-O-Si-O- \\ | & | \\ O & O \\ | & | \end{array}\right]_n$ |
| Porous silica | 2.4 to 1.8 | — |
| Organic | | |
| SiOC | 2.9 to 2.7 | $\left[\begin{array}{cc} CH_3 & O \\ | & | \\ -Si-O-Si-O- \\ | & | \\ O & O \\ | & | \end{array}\right]_n$ |
| Porous SiOC | 2.5 to 2.2 | — |
| MSQ | 2.9 to 2.7 | $\left[\begin{array}{cc} CH_3 & O \\ | & | \\ -Si-O-Si-O- \\ | & | \\ O & O \\ | & | \end{array}\right]_n$ |
| Porous MSQ | 2.5 to 1.8 | — |

TABLE 1-continued

| Interlayer insulating film | Relative dielectric constant | Structure |
|---|---|---|
| Organic polymers | | |
| Polyimide | 3.5 to 3 | $\left[-R1-N\begin{array}{c}CO\\ \\CO\end{array}R2\begin{array}{c}CO\\ \\CO\end{array}N-\right]_n$ (R1, R2) |
| BARERIN etc. | 3 to 2.2 | $\left[-CF2-\bigcirc-CF2-\right]_n$ |
| Teflon (registered trademark) etc. | 2.4 to 2 | $-[CF2-CF2]_m-[CF-CF]_n-$ with O—C(CF3)(CF3)—O bridge |
| Amorphous carbon (F added) | <2.5 | — |

However, on the surface of an insulating film revealed by CMP, residue (shavings) of the insulating film arises due to erosion (caused by the polishing) of the insulating film on wiring due to a difference in the polishing characteristics of the insulating film depending on the density of the wiring pattern under the insulating film, and a reaction product between the $SiO_2$ particles and the constituent material of the insulating film also arises.

Moreover, for an interlayer insulating film made of a porous material, the mechanical strength is low and adhesion to a conductive film is weak due to the many voids in the interlayer insulating film, and hence if the wafer is pushed by the head 202 at a normally used pressure in the CMP, then breaking away of the interlayer insulating film from the conductive film or disintegration of the interlayer insulating film occurs. To counteract this, in the case of using a porous material as an interlayer insulating film material, the wafer must be pushed at a low pressure, for example a pressure of not more than approximately 1.0 kPa, but with such low pressure CMP, the interlayer insulating film cannot be polished sufficiently, and hence unpolished portions arise on the surface of the interlayer insulating film polished by the CMP.

Such residue, reaction product, and unpolished portions (hereinafter referred to collectively as "polishing remnants") on the surface of an insulating film are a causal factor in abnormalities in the inter-layer capacitance of a capacitor, or the wiring resistance, in an electronic device manufactured from the wafer, and must thus be removed.

Moreover, in the case of using CMP to polish away a conductive film that has been formed on a low dielectric constant interlayer insulating film, the revealed low dielectric constant interlayer insulating film is chemically damaged due to the low dielectric constant interlayer insulating film absorbing moisture due to contact between the surface of the low dielectric constant interlayer insulating film and the slurry or cleaning liquid used in the CMP, whereby a surface damaged layer (damaged layer) having a reduced carbon concentration is formed on the surface of the low dielectric constant interlayer insulating film.

Such a surface damaged layer has similar properties to $SiO_2$ (the native oxide), undergoing volume shrinkage in a subsequently implemented heat treatment step, which causes voids to be produced in the insulating film. It is thus necessary to remove the surface damaged layer before implementing such a subsequent step.

As a process for removing such a surface damaged layer and polishing remnants from the surface of an insulating film, a cleaning process is known in which the surface of the insulating film is cleaned using a post-CMP cleaning liquid comprised of a quaternary ammonium hydroxide, a polar organic amine, or the like.

However, such a cleaning process uses a liquid chemical and is thus categorized as a wet etching process. The surface damaged layer and polishing remnants are thus readily dissolved by the cleaning liquid in the cleaning process, and hence there is a problem that it is difficult to control the amount removed of the surface damaged layer and polishing remnants. Here, if the surface damaged layer and polishing remnants are dissolved too much by the cleaning liquid, then copper wiring disposed under the insulating film will be revealed, and hence the copper wiring will be corroded by the cleaning liquid.

SUMMARY OF THE INVENTION

It is an object of the present invention to provide a method of processing a substrate, a post-chemical mechanical polishing cleaning method, and a method of and program for manufacturing an electronic device, which enable a surface damaged layer and polishing remnants on the surface of an insulating film to be removed, and enable the amount removed of the surface damaged layer and polishing remnants to be controlled easily.

To attain the above object, in a first aspect of the present invention, there is provided a method of processing a substrate having thereon an insulating film that has been revealed by chemical mechanical polishing, the method comprising an insulating film exposure step of exposing the revealed insulating film to an atmosphere of a mixed gas containing ammonia and hydrogen fluoride under a predetermined pressure, and an insulating film heating step of heating to a predetermined temperature the insulating film that has been exposed to the atmosphere of the mixed gas.

According to the above method, the revealed insulating film is exposed to an atmosphere of a mixed gas containing ammonia and hydrogen fluoride under a predetermined pressure, and then the insulating film that has been exposed to the atmosphere of the mixed gas is heated to a predetermined temperature. Upon the revealed insulating film being exposed to the atmosphere of the mixed gas containing ammonia and hydrogen fluoride under the predetermined pressure, a product based on the revealed insulating film and the mixed gas is produced, and then upon the insulating film that has been exposed to the atmosphere of the mixed gas being heated to the predetermined temperature, the above product is heated and thus vaporized. Through the product being vaporized, a surface damaged layer and polishing remnants on the surface of the insulating film produced through the chemical mechanical polishing can be removed. At this time, the amount produced of the product can be controlled through parameters of the mixed gas. Control of the amount removed of the surface damaged layer and polishing remnants on the surface of the insulating film can thus be carried out easily.

Preferably, the revealed insulating film is a low dielectric constant insulating film.

Also preferably, in the insulating film exposure step, the substrate is subjected to plasma-less etching.

According to the above method, the substrate is subjected to plasma-less etching. As a result, charge is not accumulated on a gate electrode in an electronic device manufactured from the substrate, and hence degradation or destruction of a gate oxide film can be prevented. Moreover, the electronic device is not irradiated with energetic particles, and hence semiconductor damage due to being struck by such energetic particles (i.e. crystal defects) can be prevented from occurring. Furthermore, unanticipated chemical reactions caused by plasma do not occur, and hence generation of impurities can be prevented, whereby contamination of the processing chambers in which the substrate is processed can be prevented.

Preferably, in the insulating film exposure step, the substrate is subjected to dry cleaning.

According to the above method, the substrate is subjected to dry cleaning. As a result, surface roughness can be prevented from occurring, and moreover changes in properties of the substrate surface can be suppressed, and hence a decrease in wiring reliability can be reliably prevented.

Preferably, a volumetric flow rate ratio of the hydrogen fluoride to the ammonia in the mixed gas is in a range of 1 to 1/2, and the predetermined pressure is in a range of $6.7 \times 10^{-2}$ to 4.0 Pa.

According to the above method, the volumetric flow rate ratio of the hydrogen fluoride to the ammonia in the mixed gas is in a range of 1 to 1/2, and the predetermined pressure is in a range of $6.7 \times 10^{-2}$ to 4.0 Pa. As a result, production of the product can be promoted, and hence the surface damaged layer and polishing remnants on the surface of the insulating film can be reliably removed.

Also preferably, the predetermined temperature is in a range of 80 to 200° C.

According to the above method, the predetermined temperature is in a range of 80 to 200° C. As a result, vaporization of the product can be promoted, and hence the surface damaged layer and polishing remnants on the surface of the insulating film can be reliably removed.

Preferably, the method further comprises a product production condition deciding step of measuring a shape of the revealed insulating film, and deciding at least one of the volumetric flow rate ratio of the hydrogen fluoride to the ammonia in the mixed gas and the predetermined pressure in accordance with the measured shape.

According to the above method, the shape of the revealed insulating film is measured, and at least one of the volumetric flow rate ratio of the hydrogen fluoride to the ammonia in the mixed gas and the predetermined pressure is decided in accordance with the measured shape. As a result, the amount removed of the surface damaged layer and polishing remnants on the surface of the insulating film can be controlled precisely, and hence the efficiency of the substrate surface processing can be improved. Furthermore, when removing some of the insulating film so as to eliminate local erosion that has arisen due to the chemical mechanical polishing, the amount removed of the insulating film can be controlled precisely, and hence re-flattening can be carried out precisely.

Preferably, the revealed insulating film has thereon unpolished portions produced through the chemical mechanical polishing.

Preferably, the revealed insulating film has thereon a reaction product originating from a polishing agent used in the chemical mechanical polishing.

Also preferably, the insulating film has thereon a surface damaged layer having a reduced carbon concentration.

To attain the above object, in a second aspect of the present invention, there is provided a post-chemical mechanical polishing cleaning method carried out on a substrate after a conductive film formed on an insulating film formed on a surface of the substrate has been polished away by chemical mechanical polishing, the method comprising an insulating film exposure step of exposing the insulating film, which has been revealed through the chemical mechanical polishing, to an atmosphere of a mixed gas containing ammonia and hydrogen fluoride under a predetermined pressure, and an insulating film heating step of heating to a predetermined temperature the insulating film that has been exposed to the atmosphere of the mixed gas.

According to the above method, the insulating film that has been revealed through the chemical mechanical polishing is exposed to an atmosphere of a mixed gas containing ammonia and hydrogen fluoride under a predetermined pressure, and then the insulating film that has been exposed to the atmosphere of the mixed gas is heated to a predetermined temperature. Upon the revealed insulating film being exposed to the atmosphere of the mixed gas containing ammonia and hydrogen fluoride under the predetermined pressure, a product based on the revealed insulating film and the mixed gas is produced, and then upon the insulating film that has been exposed to the atmosphere of the mixed gas being heated to the predetermined temperature, the above product is heated and thus vaporized. Through the product being vaporized, a surface damaged layer and polishing remnants on the surface of the insulating film produced through the chemical mechanical polishing can be removed. At this time, the amount produced of the product can be controlled through parameters of the mixed gas. Control of the amount removed of the surface damaged layer and polishing remnants on the surface of the insulating film can thus be carried out easily.

Preferably, the method further comprises an insulating film drying step of drying a surface of the revealed insulating film before exposing the revealed insulating film to the atmosphere of the mixed gas.

According to the above method, the surface of the revealed insulating film is dried before the revealed insulating film is exposed to the atmosphere of the mixed gas. The production of the product is promoted under the resulting dry environment. The removal of the surface damaged layer and polishing remnants on the surface of the insulating film can thus be promoted.

To attain the above object, in a third aspect of the present invention, there is provided a method of manufacturing an electronic device, the method comprising a wiring formation step of forming wiring made of a first conductive material in a first insulating film that has been formed on a surface of a semiconductor substrate, a second insulating film formation step of forming a second insulating film on the first insulating film so as to cover the wiring, a photoresist layer formation step of forming a photoresist layer in a predetermined pattern on the formed second insulating film, a plasma fabrication step of fabricating a connecting hole reaching the wiring in the second insulating film by plasma processing using the formed photoresist layer, an ashing step of removing the photoresist layer, a connecting hole filling step of forming a conductive film made of a second conductive material on the second insulating film so as to fill the connecting hole with the second conductive material, a conductive film polishing step of polishing away the formed conductive film by chemical mechanical polishing, a second insulating film exposure step of exposing the second insulating film, which has been revealed through the chemical mechanical polishing, to an atmosphere of a mixed gas containing ammonia and hydrogen fluoride under a predetermined pressure, and a second insulating film heating step of heating to a predetermined temperature the second insulating film that has been exposed to the atmosphere of the mixed gas.

According to the above method, the second insulating film that has been revealed through the chemical mechanical polishing is exposed to an atmosphere of a mixed gas containing ammonia and hydrogen fluoride under a predetermined pressure, and then the second insulating film that has been exposed to the atmosphere of the mixed gas is heated to a predetermined temperature. Upon the revealed second insulating film being exposed to the atmosphere of the mixed gas containing ammonia and hydrogen fluoride under the predetermined pressure, a product based on the revealed second insulating film and the mixed gas is produced, and then upon the second insulating film that has been exposed to the atmosphere of the mixed gas being heated to the predetermined temperature, the above product is heated and thus vaporized. Through the product being vaporized, a surface damaged layer and polishing remnants on the surface of the second insulating film produced through the chemical mechanical polishing can be removed. At this time, the amount produced of the product can be controlled through parameters of the mixed gas. Control of the amount removed of the surface damaged layer and polishing remnants on the surface of the second insulating film can thus be carried out easily.

Preferably, the method further comprises a connecting hole surface exposure step of exposing a surface of the fabricated connecting hole to an atmosphere of a mixed gas containing ammonia and hydrogen fluoride under a predetermined pressure, and a connecting hole surface heating step of heating to a predetermined temperature the surface of the connecting hole that has been exposed to the atmosphere of the mixed gas.

According to the above method, the surface of the connecting hole fabricated in the second insulating film is exposed to an atmosphere of a mixed gas containing ammonia and hydrogen fluoride under a predetermined pressure. As a result, a product is produced on the surface of the connecting hole, and then the product is vaporized by heating, whereby a surface damaged layer on the connecting hole produced due to the plasma processing can be removed, and hence wiring delay due to the surface damaged layer can be prevented from occurring.

More preferably, the method further comprises a connecting hole coating step of coating the surface of the connecting hole that has been heated to the predetermined temperature with a conductive barrier.

According to the above method, the surface of the connecting hole that has been heated to the predetermined temperature is coated with a conductive barrier. As a result, the surface of the connecting hole from which the surface damaged layer has been removed, and the second conductive material subsequently filled into the connecting hole can be prevented from coming into contact with one another, whereby diffusion of the second conductive material into the second insulating film can be prevented.

To attain the above object, in a fourth aspect of the present invention, there is provided a method of manufacturing an electronic device, the method comprising a wiring formation step of forming wiring made of a first conductive material in a first insulating film that has been formed on a surface of a semiconductor substrate, a second insulating film formation step of forming a second insulating film on the first insulating film so as to cover the wiring, a photoresist layer formation step of forming a photoresist layer in a predetermined pattern on the formed second insulating film, a plasma fabrication step of fabricating a connecting hole reaching the wiring in the second insulating film by plasma processing using the formed photoresist layer, a connecting hole filling step of forming a conductive film made of a second conductive material on the second insulating film so as to fill the connecting hole with the second conductive material, a conductive film polishing step of polishing away the photoresist layer and the formed conductive film by chemical mechanical polishing, a second insulating film exposure step of exposing the second insulating film, which has been revealed through the chemical mechanical polishing, to an atmosphere of a mixed gas containing ammonia and hydrogen fluoride under a predetermined pressure, and a second insulating film heating step of heating to a predetermined temperature the second insulating film that has been exposed to the atmosphere of the mixed gas.

According to the above method, the second insulating film that has been revealed through the chemical mechanical polishing is exposed to an atmosphere of a mixed gas containing ammonia and hydrogen fluoride under a predetermined pressure, and then the second insulating film that has been exposed to the atmosphere of the mixed gas is heated to a predetermined temperature. Upon the revealed second insulating film being exposed to the atmosphere of the mixed gas containing ammonia and hydrogen fluoride under the predetermined pressure, a product based on the revealed second insulating film and the mixed gas is produced, and then upon the second insulating film that has been exposed to the atmosphere of the mixed gas being heated to the predetermined temperature, the above product is heated and thus vaporized. Through the product being vaporized, a surface damaged layer and polishing remnants on the surface of the second insulating film produced through the chemical mechanical polishing can be removed. At this time, the amount produced of the product can be controlled through parameters of the mixed gas. Control of the amount removed of the surface damaged layer and polishing remnants on the surface of the second insulating film can thus be carried out easily. Moreover, the photoresist layer is polished away by the chemical mechanical polishing at the same time as the conductive film, and hence the throughput can be improved.

To attain the above object, in a fifth aspect of the present invention, there is provided a program for causing a computer to execute a method of processing a substrate having thereon an insulating film that has been revealed by chemical mechanical polishing, the program comprising an insulating film exposure module for exposing the revealed insulating film to an atmosphere of a mixed gas containing ammonia and hydrogen fluoride under a predetermined pressure, and an insulating film heating module for heating to a predetermined temperature the insulating film that has been exposed to the atmosphere of the mixed gas.

According to the above program, effects as for the first aspect can be achieved.

To attain the above object, in a sixth aspect of the present invention, there is provided a program for causing a computer to execute a post-chemical mechanical polishing cleaning method carried out on a substrate after a conductive film formed on an insulating film formed on a surface of the substrate has been polished away by chemical mechanical polishing, the program comprising an insulating film exposure module for exposing the insulating film, which has been revealed through the chemical mechanical polishing, to an atmosphere of a mixed gas containing ammonia and hydrogen fluoride under a predetermined pressure, and an insulating film heating module for heating to a predetermined temperature the insulating film that has been exposed to the atmosphere of the mixed gas.

According to the above program, effects as for the second aspect can be achieved.

To attain the above object, in a seventh aspect of the present invention, there is provided a program for causing a computer to execute a method of manufacturing an electronic device, the program comprising a wiring formation module for forming wiring made of a first conductive material in a first insulating film that has been formed on a surface of a semiconductor substrate, a second insulating film formation module for forming a second insulating film on the first insulating film so as to cover the wiring, a photoresist layer formation module for forming a photoresist layer in a predetermined pattern on the formed second insulating film, a plasma fabrication module for fabricating a connecting hole reaching the wiring in the second insulating film by plasma processing using the formed photoresist layer, an ashing module for removing the photoresist layer, a connecting hole filling module for forming a conductive film made of a second conductive material on the second insulating film so as to fill the connecting hole with the second conductive material, a conductive film polishing module for polishing away the formed conductive film by chemical mechanical polishing, a second insulating film exposure module for exposing the second insulating film, which has been revealed through the chemical mechanical polishing, to an atmosphere of a mixed gas containing ammonia and hydrogen fluoride under a predetermined pressure, and a second insulating film heating module for heating to a predetermined temperature the second insulating film that has been exposed to the atmosphere of the mixed gas.

According to the above program, effects as for the third aspect can be achieved.

To attain the above object, in an eighth aspect of the present invention, there is provided a program for causing a computer to execute a method of manufacturing an electronic device, the program comprising a wiring formation module for forming wiring made of a first-conductive material in a first insulating film that has been formed on a surface of a semiconductor substrate, a second insulating film formation module for forming a second insulating film on the first insulating film so as to cover the wiring, a photoresist layer formation module for forming a photoresist layer in a predetermined pattern on the formed second insulating film, a plasma fabrication module for fabricating a connecting hole reaching the wiring in the second insulating film by plasma processing using the formed photoresist layer, a connecting hole filling module for forming a conductive film made of a second conductive material on the second insulating film so as to fill the connecting hole with the second conductive material, a conductive film polishing module for polishing away the photoresist layer and the formed conductive film by chemical mechanical polishing, a second insulating film exposure module for exposing the second insulating film, which has been revealed through the chemical mechanical polishing, to an atmosphere of a mixed gas containing ammonia and hydrogen fluoride under a predetermined pressure, and a second insulating film heating module for heating to a predetermined temperature the second insulating film that has been exposed to the atmosphere of the mixed gas.

According to the above program, effects as for the fourth aspect can be achieved.

The above and other objects, features, and advantages of the invention will become more apparent from the following detailed description taken in conjunction with the accompanying drawings.

BRIEF DESCRIPTION OF THE DRAWINGS

FIG. 2A is a sectional view taken along line II-II in FIG. 1; and

FIG. 2B is an enlarged view of a portion A shown in FIG. 2A;

DETAILED DESCRIPTION OF THE PREFERRED EMBODIMENTS

The present invention will now be described in detail with reference to the drawings showing preferred embodiments thereof.

First, a method of processing a substrate according to an embodiment of the present invention will be described.

Figure 1:
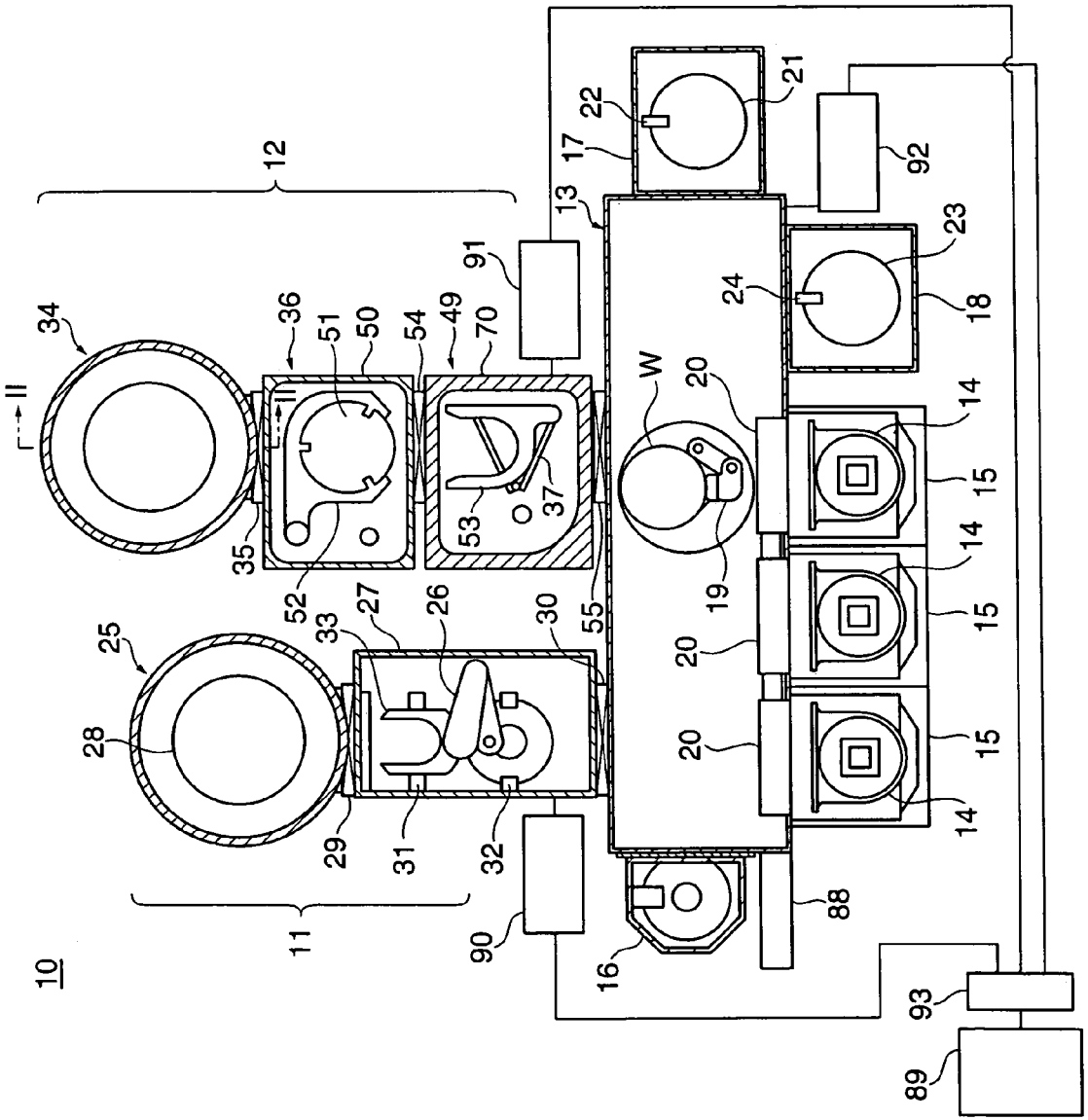
FIG. 1 is a plan view schematically showing the construction of a substrate processing apparatus to which is applied a method of processing a substrate according to an embodiment of the present invention.

FIG. 1 is a plan view schematically showing the construction of a substrate processing apparatus to which is applied the method of processing a substrate according to the present embodiment.

As shown in FIG. 1, the substrate processing apparatus 10 is comprised of a first process ship 11 for carrying out reactive ion etching (hereinafter referred to as "RIE") on electronic device wafers (hereinafter referred to merely as "wafers") (substrates) W, a second process ship 12 that is disposed parallel to the first process ship 11 and is for carrying out COR (chemical oxide removal) processing and PHT (post heat treatment) processing, described below, on the wafers W, and a loader unit 13, which is a rectangular common transfer chamber to which each of the first process ship 11 and the second process ship 12 is connected.

In addition to the first process ship 11 and the second process ship 12, the loader unit 13 has connected thereto three FOUP mounting stages 15 on each of which is mounted a FOUP (front opening unified pod) 14, which is a container housing twenty-five of the wafers W, an orienter 16 that carries out pre-alignment of the position of each wafer W transferred out from a FOUP 14, and first and second IMS's (Integrated Metrology Systems, made by Therma-Wave, Inc.) 17 and 18 for measuring the surface state of each wafer W.

The first process ship 11 and the second process ship 12 are each connected to a side wall of the loader unit 13 in a longitudinal direction of the loader unit 13, disposed facing the three FOUP mounting stages 15 with the loader unit 13 therebetween. The orienter 16 is disposed at one end of the loader unit 13 in the longitudinal direction of the loader unit 13. The first IMS 17 is disposed at the other end of the loader unit 13 in the longitudinal direction of the loader unit 13. The second IMS 18 is disposed alongside the three FOUP mounting stages 15.

A SCARA-type dual arm transfer arm mechanism 19 for transferring the wafers W is disposed inside the loader unit 13, and three loading ports 20 through which the wafers W are introduced into the loader unit 13 are disposed in a side wall of the loader unit 13 in correspondence with the FOUP mounting stages 15. The transfer arm mechanism 19 takes a wafer W out from a FOUP 14 mounted on a FOUP mounting stage 15 through the corresponding loading port 20, and transfers the removed wafer W into and out of the first process ship 11, the second process ship 12, the orienter 16, the first IMS 17, and the second IMS 18.

The first IMS 17 is an optical monitor having a mounting stage 21 on which is mounted a wafer W that has been transferred into the first IMS 17, and an optical sensor 22 that is directed at the wafer W mounted on the mounting stage 21. The first IMS 17 measures the surface shape of the wafer W, for example the thickness of a surface layer, and CD (critical dimension) values of wiring grooves, gate electrodes and so on. Like the first IMS 17, the second IMS 18 is also an optical monitor, and has a mounting stage 23 and an optical sensor 24. The second IMS 18 measures the number of particles on the surface of each wafer W.

The first process ship 11 has a first processing unit 25 as a first vacuum processing chamber in which RIE is carried out on each wafer W, and a first load lock unit 27 containing a link-type single pick type first transfer arm 26 for transferring each wafer W into and out of the first processing unit 25.

The first processing unit 25 has a cylindrical processing chamber (chamber). An upper electrode and a lower electrode are disposed in the chamber, the distance between the upper electrode and the lower electrode is set to an appropriate value for carrying out the RIE on each wafer W. Moreover, the lower electrode has in a top portion thereof an ESC (electrostatic chuck) 28 for chucking the wafer W thereto using a Coulomb force or the like.

In the first processing unit 25, a processing gas is introduced into the chamber and an electric field is generated between the upper electrode and the lower electrode, whereby the introduced processing gas is turned into plasma so as to produce ions and radicals. The wafer W is subjected to the RIE by the ions and radicals.

In the first process ship 11, the internal pressure of the first processing unit 25 is held at vacuum, whereas the internal pressure of the loader unit 13 is held at atmospheric pressure. The first load lock unit 27 is thus provided with a vacuum gate valve 29 in a connecting part between the first load lock unit 27 and the first processing unit 25, and an atmospheric gate valve 30 in a connecting part between the first load lock unit 27 and the loader unit 13, whereby the first load lock unit 27 is constructed as a preliminary vacuum transfer chamber whose internal pressure can be adjusted.

Within the first load lock unit 27, the first transfer arm 26 is disposed in an approximately central portion of the first load lock unit 27; first buffers 31 are disposed toward the first processing unit 25 with respect to the first transfer arm 26, and second buffers 32 are disposed toward the loader unit 13 with respect to the first transfer arm 26. The first buffers 31 and the second buffers 32 are disposed above a track along which a supporting portion (pick) 33 moves, the supporting portion 33 being disposed at the distal end of the first transfer arm 26 and being for supporting each wafer W. After having being subjected to the RIE, each wafer W is temporarily laid by above the track of the supporting portion 33, whereby swapping over of the wafer W that has been subjected to the RIE and a wafer W yet to be subjected to the RIE can be carried out smoothly in the first processing unit 25.

The second process ship 12 has a second processing unit 34 as a second vacuum processing chamber in which the COR processing is carried out on each wafer W, a third processing unit 36 as a third vacuum processing chamber that is connected to the second processing unit 34 via a vacuum gate valve 35 and in which the PHT processing is carried out on each wafer W, and a second load lock unit 49 containing a link-type single-pick type second transfer arm 37 for transferring each wafer W into and out of the second processing unit 34 and the third processing unit 36.

Figure 2A:
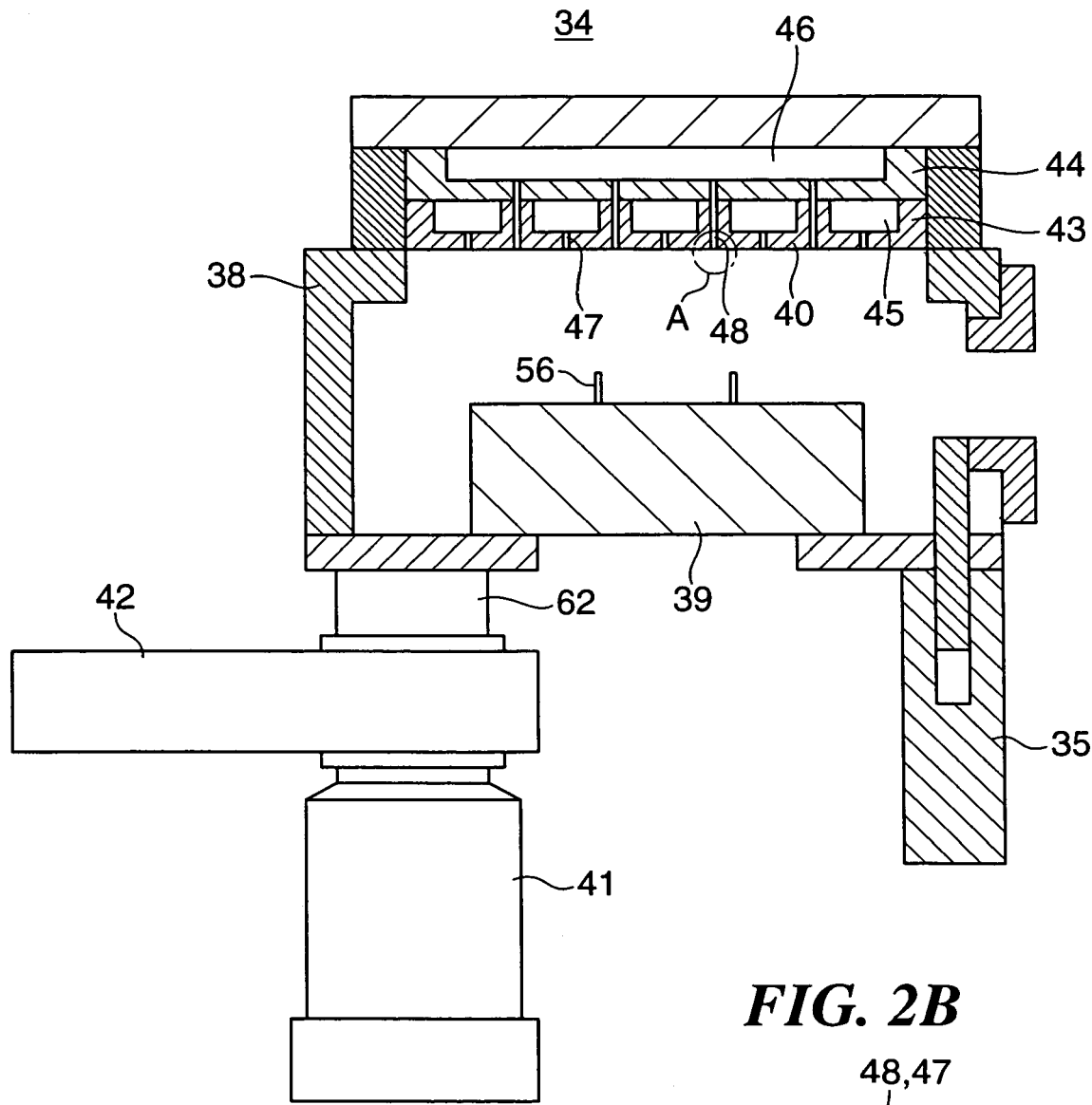
FIGS. 2A and 2B are sectional views of a second processing unit appearing in FIG. 1; specifically.
Figure 2B:
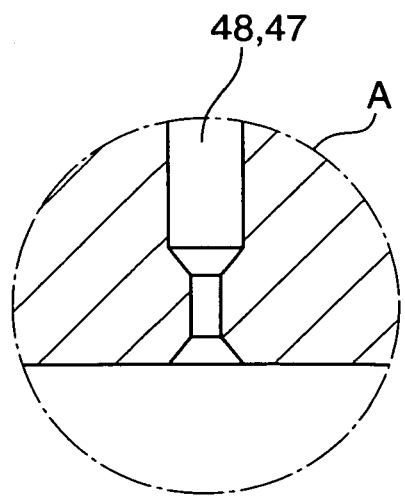

FIGS. 2A and 2B are sectional views of the second processing unit 34 appearing in FIG. 1; specifically, FIG. 2A is a sectional view taken along line II-II in FIG. 1, and FIG. 2B is an enlarged view of a portion A shown in FIG. 2A.

As shown in FIG. 2A, the second processing unit 34 has a cylindrical processing chamber (chamber) 38, an ESC 39 as a wafer W mounting stage disposed in the chamber 38, a shower head 40 disposed above the chamber 38, a TMP (turbo molecular pump) 41 for exhausting gas out from the chamber 38, and an APC (automatic pressure control) valve 42 that is a variable butterfly valve disposed between the chamber 38 and the TMP 41 for controlling the pressure in the chamber 38.

The ESC 39 has therein an electrode plate (not shown) to which a DC voltage is applied. A wafer W is attracted to and held on the ESC 39 through a Johnsen-Rahbek force or a Coulomb force generated by the DC voltage. Moreover, the ESC 39 also has a coolant chamber (not shown) as a temperature adjusting mechanism. A coolant, for example cooling water or a Galden fluid, at a predetermined temperature is circulated through the coolant chamber. A processing temperature of the wafer W held on an upper surface of the ESC 39 is controlled through the temperature of the coolant. Furthermore, the ESC 39 also has a heat-transmitting gas supply system (not shown) that supplies a heat-transmitting gas (helium gas) uniformly between the upper surface of the ESC 39 and a rear surface of the wafer W. The heat-transmitting gas carries out heat exchange between the wafer W and the ESC 39, which is held at a desired specified temperature by the coolant, during the COR processing, thus cooling the wafer W efficiently and uniformly.

Moreover, the ESC 39 has a plurality of pusher pins 56 as lifting pins that can be made to project out from the upper surface of the ESC 39. The pusher pins 56 are housed inside the ESC 39 when a wafer W is attracted to and held on the ESC 39, and are made to project out from the upper surface of the ESC 39 so as to lift the wafer W up when the wafer W is to be transferred out from the chamber 38 after having been subjected to the COR processing.

The shower head 40 has a two-layer structure comprised of a lower layer portion 43 and an upper layer portion 44. The lower layer portion 43 has first buffer chambers 45 therein, and the upper layer portion 44 has a second buffer chamber 46 therein. The first buffer chambers 45 and the second buffer chamber 46 are communicated with the interior of the chamber 38 via gas-passing holes 47 and 48 respectively. That is, the shower head 40 is comprised of two plate-shaped members (the lower layer portion 43 and the upper layer portion 44) that are disposed on one another and have therein internal channels leading into the chamber 38 for gas supplied into the first buffer chambers 45 and the second buffer chamber 46.

When carrying out COR processing on a wafer W, $NH_3$ (ammonia) gas is supplied into the first buffer chambers 45 from an ammonia gas supply pipe 57, described below, and the supplied ammonia gas is then supplied via the gas-passing holes 47 into the chamber 38, and moreover HF (hydrogen fluoride) gas is supplied into the second buffer chamber 46 from a hydrogen fluoride gas supply pipe 58, described below, and the supplied hydrogen fluoride gas is then supplied via the gas-passing holes 48 into the chamber 38.

Moreover, the shower head 40 also has a heater, for example a heating element, (not shown) built therein. The heating element is preferably disposed on the upper layer portion 44, for controlling the temperature of the hydrogen fluoride gas in the second buffer chamber 46.

Moreover, a portion of each of the gas-passing holes 47 and 48 where the gas-passing hole 47 or 48 opens out into the chamber 38 is formed so as to widen out toward an end thereof as shown in FIG. 2B. As a result, the ammonia gas and the hydrogen fluoride gas can be made to diffuse through the chamber 38 efficiently. Furthermore, each of the gas-passing holes 47 and 48 has a cross-sectional shape having a constriction therein. As a result, any deposit produced in the chamber 38 can be prevented from flowing back into the gas-passing holes 47 and 48, and thus the first buffer chambers 45 and the second buffer chamber 46. Alternatively, the gas-passing holes 47 and 48 may each have a spiral shape.

In the second processing unit 34, the COR processing is carried out on a wafer W by adjusting the pressure in the chamber 38 and the volumetric flow rate ratio between the ammonia gas and the hydrogen fluoride gas. Moreover, the second processing unit 34 is designed such that the ammonia gas and the hydrogen fluoride gas first mix with one another in the chamber 38 (post-mixing design), and hence the two gases are prevented from mixing together until they are introduced into the chamber 38, whereby the hydrogen fluoride gas and the ammonia gas are prevented from reacting with one another before being introduced into the chamber 38.

Moreover, in the second processing unit 34, a heater, for example a heating element, (not shown) is built into a side wall of the chamber 38, whereby the temperature of the atmosphere in the chamber 38 can be prevented from decreasing. As a result, the reproducibility of the COR processing can be improved. Moreover, the heating element in the side wall also controls the temperature of the side wall, whereby by-products formed in the chamber 38 can be prevented from becoming attached to the inside of the side wall.

Returning to FIG. 1, the third processing unit 36 has a box-shaped processing chamber (chamber) 50, a stage heater 51 as a wafer W mounting stage disposed in the chamber 50, a buffer arm 52 that is disposed around the stage heater 51 and lifts up a wafer W mounted on the stage heater 51, and an PHT chamber lid (not shown) as an openable/closable lid that isolates the interior of the chamber from the external atmosphere.

The stage heater 51 is made of aluminum having an oxide film formed on a surface thereof, and heats the wafer W mounted thereon up to a predetermined temperature through heating wires or the like built therein. Specifically, the stage heater 51 directly heats the wafer W mounted thereon up to 100 to 200° C., preferably approximately 135° C., over at least 1 minute.

The PHT chamber lid has a sheet heater made of silicone rubber disposed thereon. Moreover, a cartridge heater (not shown) is built into a side wall of the chamber 50. The cartridge heater controls the wall surface temperature of the side wall of the chamber 50 to a temperature in a range of 25 to 80° C. As a result, by-products are prevented from becoming attached to the side wall of the chamber 50, whereby particles due to such attached by-products are prevented from arising, and hence the time period between one cleaning and the next of the chamber 50 can be extended. Moreover, an outer periphery of the chamber 50 is covered by a heat shield.

Instead of the sheet heater described above, a UV (ultraviolet) radiation heater may alternatively be used as the heater for heating the wafer W from above. An example of such a UV radiation heater is a UV lamp that emits UV radiation of wavelength 190 to 400 nm.

After being subjected to the COR processing, each wafer W is temporarily laid by on a track of a supporting portion 53 of the second transfer arm 37 by the buffer arm 52, whereby swapping over of wafers W in the second processing unit 34 and the third processing unit 36 can be carried out smoothly.

In the third processing unit 36, the PHT processing is carried out on each wafer W by adjusting the temperature of the wafer W.

The second load lock unit 49 has a box-shaped transfer chamber (chamber) 70 containing the second transfer arm 37. The internal pressure of each of the second processing unit 34 and the third processing unit 36 is held at vacuum, whereas the internal pressure of the loader unit 13 is held at atmospheric pressure. The second load lock unit 49 is thus provided with a vacuum gate valve 54 in a connecting part between the second load lock unit 49 and the third processing unit 36, and an atmospheric door valve 55 in a connecting part between the second load lock unit 49 and the loader unit 13, whereby the second load lock unit 49 is constructed as a preliminary vacuum transfer chamber whose internal pressure can be adjusted.

Figure 3:
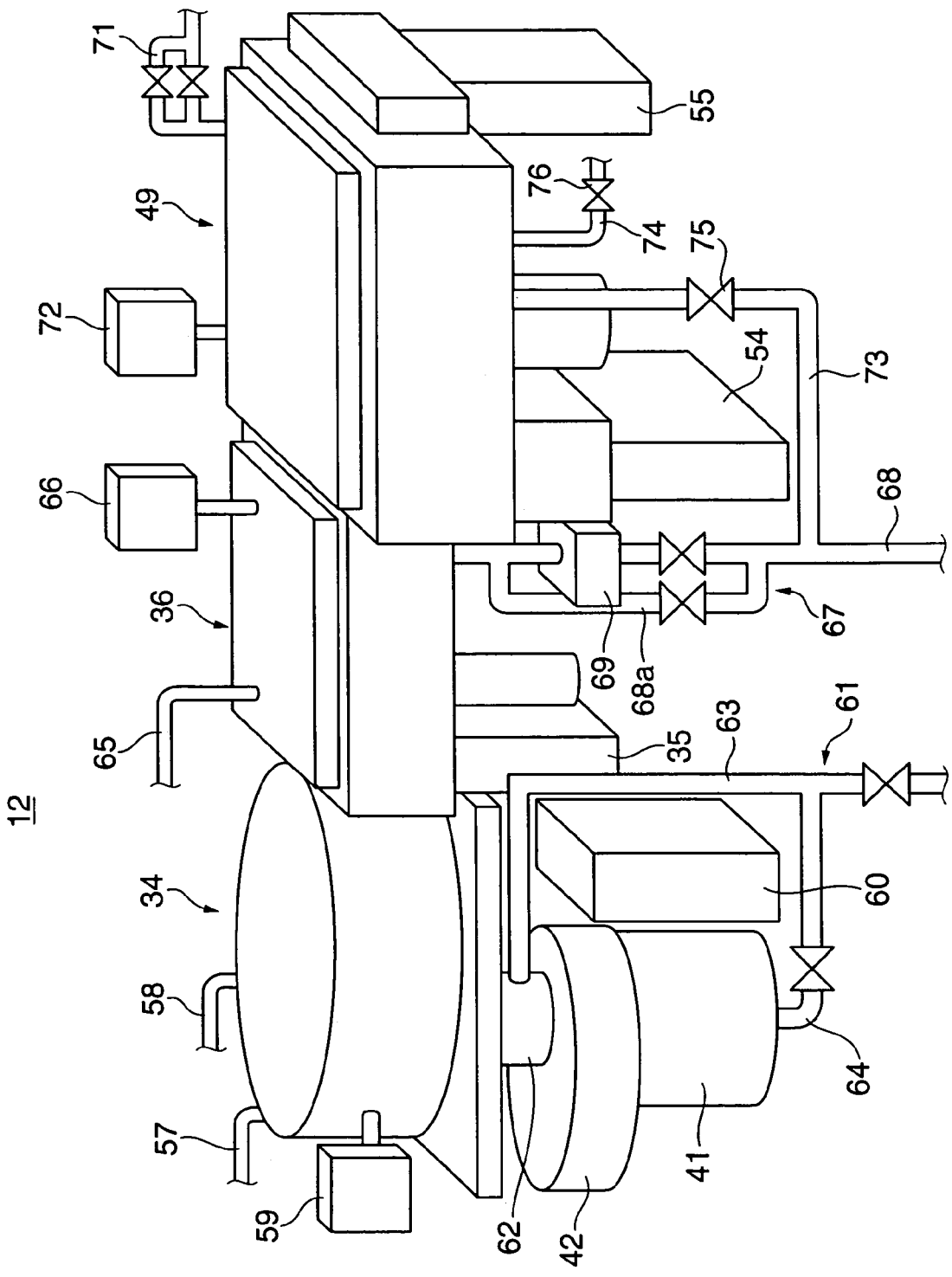
FIG. 3 is a perspective view schematically showing the construction of a second process ship appearing in FIG. 1.

FIG. 3 is a perspective view schematically showing the construction of the second process ship 12 appearing in FIG. 1.

As shown in FIG. 3, the second processing unit 34 has the ammonia gas supply pipe 57 for supplying ammonia gas into the first buffer chambers 45, the hydrogen fluoride gas supply pipe 58 for supplying hydrogen fluoride gas into the second buffer chamber 46, a pressure gauge 59 for measuring the pressure in the chamber 38, and a chiller unit 60 that supplies a coolant into the cooling system provided in the ESC 39.

The ammonia gas supply pipe 57 has provided therein an MFC (mass flow controller) (not shown) for adjusting the flow rate of the ammonia gas supplied into the first buffer chambers 45, and the hydrogen fluoride gas supply pipe 58 has provided therein an MFC (not shown) for adjusting the flow rate of the hydrogen fluoride gas supplied into the second buffer chamber 46. The MFC in the ammonia gas supply pipe 57 and the MFC in the hydrogen fluoride gas supply pipe 58 operate collaboratively so as to adjust the volumetric flow rate ratio between the ammonia gas and the hydrogen fluoride gas supplied into the chamber 38.

Moreover, a second processing unit exhaust system 61 connected to a DP (dry pump) (not shown) is disposed below the second processing unit 34. The second processing unit exhaust system 61 is for exhausting gas out from the chamber 38, and has an exhaust pipe 63 that is communicated with an exhaust duct 62 provided between the chamber 38 and the APC valve 42, and an exhaust pipe 64 connected below (i.e. on the exhaust side) of the TMP 41. The exhaust pipe 64 is connected to the exhaust pipe 63 upstream of the DP.

The third processing unit 36 has a nitrogen gas supply pipe 65 for supplying nitrogen ($N_2$) gas into the chamber 50, a pressure gauge 66 for measuring the pressure in the chamber 50, and a third processing unit exhaust system 67 for exhausting the nitrogen gas out from the chamber 50.

The nitrogen gas supply pipe 65 has provided therein an MFC (not shown) for adjusting the flow rate of the nitrogen gas supplied into the chamber 50. The third processing unit exhaust system 67 has a main exhaust pipe 68 that is communicated with the chamber 50 and is connected to a DP, an APC valve 69 that is disposed part way along the main exhaust pipe 68, and an auxiliary exhaust pipe 68a that branches off from the main exhaust pipe 68 so as to circumvent the APC valve 69 and is connected to the main exhaust pipe 68 upstream of the DP. The APC valve 69 controls the pressure in the chamber 50.

The second load lock unit 49 has a nitrogen gas supply pipe 71 for supplying nitrogen gas into the chamber 70, a pressure gauge 72 for measuring the pressure in the chamber 70, a second load lock unit exhaust system 73 for exhausting the nitrogen gas out from the chamber 70, and an external atmosphere communicating pipe 74 for releasing the interior of the chamber 70 to the external atmosphere.

The nitrogen gas supply pipe 71 has provided therein an MFC (not shown) for adjusting the flow rate of the nitrogen gas supplied into the chamber 70. The second load lock unit exhaust system 73 is comprised of a single exhaust pipe, which is communicated with the chamber 70 and is connected to the main exhaust pipe 68 of the third processing unit exhaust system 67 upstream of the DP. Moreover, the second load lock unit exhaust system 73 has an openable/closable exhaust valve 75 therein, and the external atmosphere communicating pipe 74 has an openable/closable relief valve 76 therein. The exhaust valve 75 and the relief valve 76 are operated collaboratively so as to adjust the pressure in the chamber 70 to any pressure from atmospheric pressure to a desired degree of vacuum.

Figure 4:
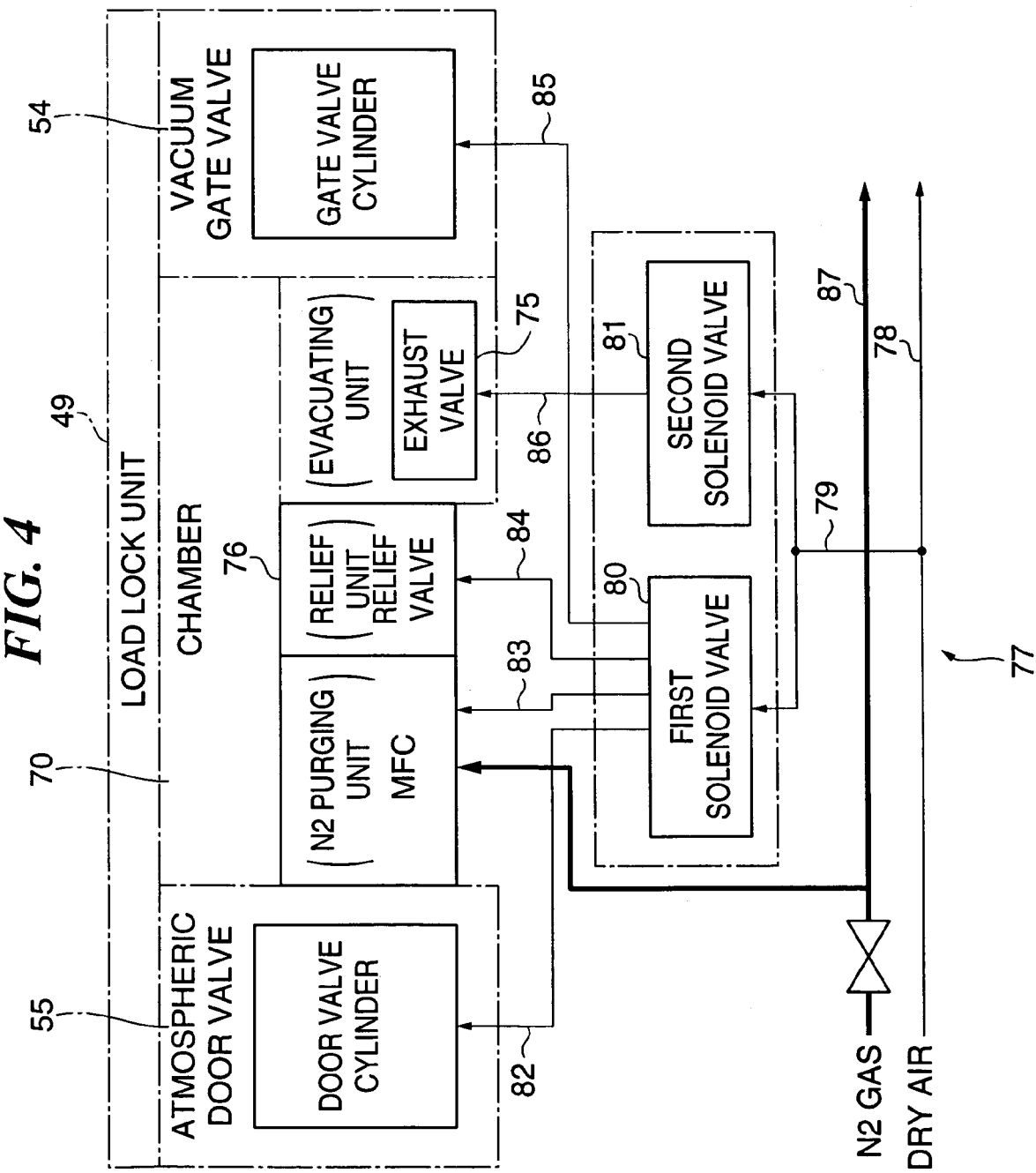
FIG. 4 is a diagram schematically showing the construction of a unit-driving dry air supply system for a second load lock unit appearing in FIG. 3.

FIG. 4 is a diagram schematically showing the construction of a unit-driving dry air supply system for the second load lock unit 49 appearing in FIG. 3.

As shown in FIG. 4, dry air from the unit-driving dry air supply system 77 for the second load lock unit 49 is supplied to a door valve cylinder for driving a sliding door of the atmospheric door valve 55, the MFC in the nitrogen gas supply pipe 71 as an $N_2$ purging unit, the relief valve 76 in the external atmosphere communicating pipe 74 as a relief unit for releasing the interior of the chamber 70 to the external atmosphere, the exhaust valve 75 in the second load lock unit exhaust system 73 as an evacuating unit, and a gate valve cylinder for driving a sliding gate of the vacuum gate valve 54.

The unit-driving dry air supply system 77 has an auxiliary dry air supply pipe 79 that branches off from a main dry air supply pipe 78 of the second process ship 12, and a first solenoid valve 80 and a second solenoid valve 81 that are connected to the auxiliary dry air supply pipe 79.

The first solenoid valve 80 is connected respectively to the door valve cylinder, the MFC, the relief valve 76, and the gate valve cylinder by dry air supply pipes 82, 83, 84, and 85, and controls operation of these elements by controlling the amount of dry air supplied thereto. Moreover, the second solenoid valve 81 is connected to the exhaust valve 75 by a dry air supply pipe 86, and controls operation of the exhaust valve 75 by controlling the amount of dry air supplied to the exhaust valve 75.

The MFC in the nitrogen gas supply pipe 71 is also connected to a nitrogen ($N_2$) gas supply system 87.

The second processing unit 34 and the third processing unit 36 also each has a unit-driving dry air supply system having a similar construction to the unit-driving dry air supply system 77 for the second load lock unit 49 described above.

Returning to FIG. 1, the substrate processing apparatus 10 has a system controller for controlling operations of the first process ship 11, the second process ship 12 and the loader unit 13, and an operation controller 88 that is disposed at one end of the loader unit 13 in the longitudinal direction of the loader unit 13.

The operation controller 88 has a display section comprised of, for example, an LCD (liquid crystal display), for displaying the state of operation of the component elements of the substrate processing apparatus 10.

Figure 5:
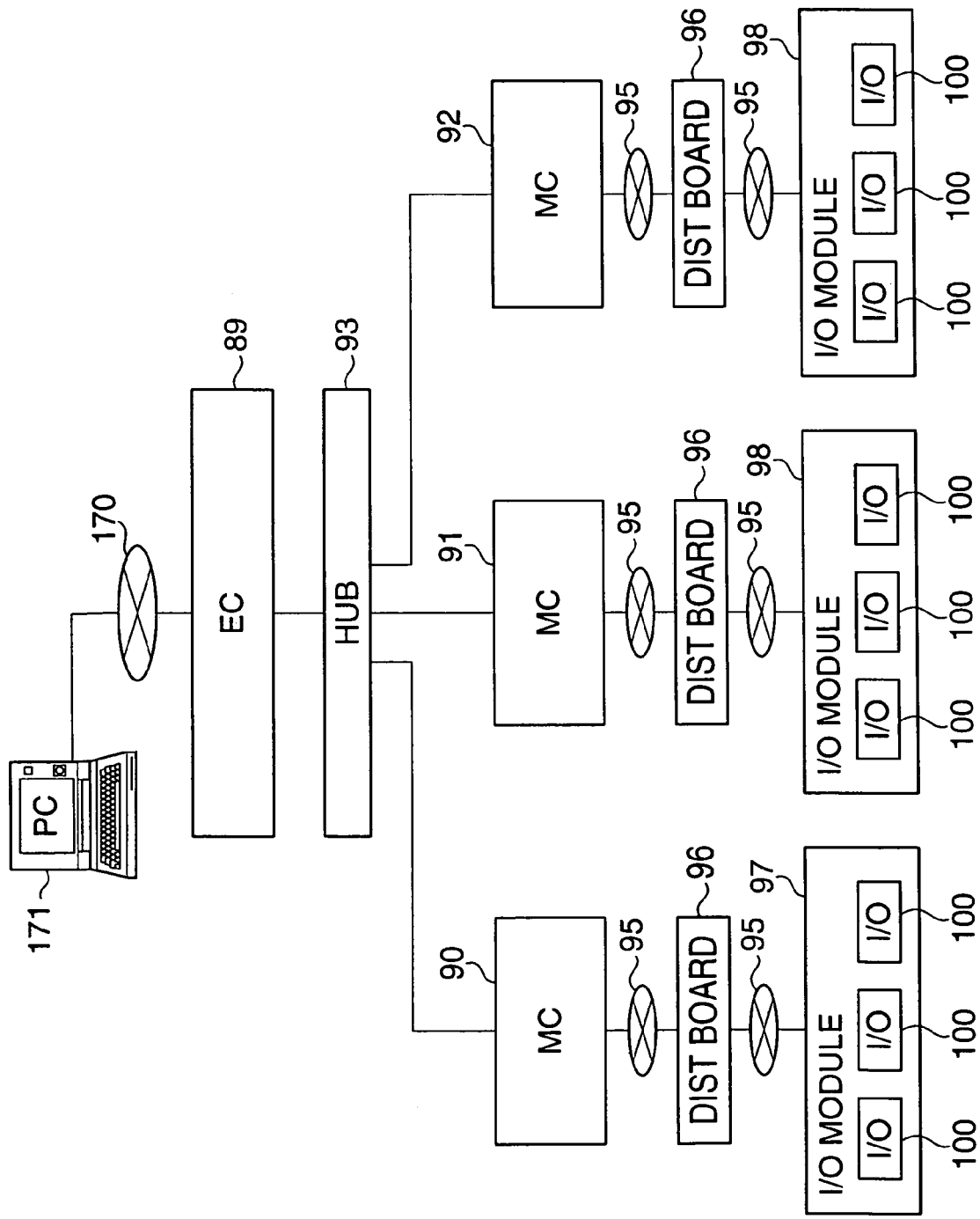
FIG. 5 is a diagram schematically showing the construction of a system controller for the substrate processing apparatus shown in FIG. 1.

Moreover, as shown in FIG. 5, the system controller is comprised of an EC (equipment controller) 89, three MC's (module controllers) 90, 91 and 92, and a switching hub 93 that connects the EC 89 to each of the MC's. The EC 89 of the system controller is connected via a LAN (local area network) 170 to a PC 171, which is an MES (manufacturing execution system) that carries out overall control of the manufacturing processes in the manufacturing plant in which the substrate processing apparatus 10 is installed. In collaboration with the system controller, the MES feeds back real real-time data on the processes in the manufacturing plant to a basic work system (not shown), and makes decisions relating to the processes in view of the overall load on the manufacturing plant and so on.

The EC 89 is a master controller (main controller) that controls the MC's and carries out overall control of the operation of the substrate processing apparatus 10. The EC 89 has a CPU, a RAM, an HDD and so on. The CPU sends control signals to the MC's in accordance with programs corresponding to wafer W processing methods, i.e. recipes, specified by a user using the operation controller 88, thus controlling the operations of the first process ship 11, the second process ship 12 and the loader unit 13.

The switching hub 93 selects at least one connection among the connections between the EC 89 and MC's in accordance with the control signals from the EC 89.

The MC's 90, 91 and 92 are slave controllers (auxiliary controllers) that control the operations of the first process ship 11, the second process ship 12, and the loader unit 13 respectively. Each of the MC's is connected respectively to an I/O (input/output) module 97, 98 or 99 through a DIST (distribution) board 96 via a GHOST network 95. Each GHOST network 95 is realized through an LSI known as a GHOST (general high-speed optimum scalable transceiver) on an MC board of the corresponding MC. A maximum of 31 I/O modules can be connected to each GHOST network 95; with respect to the GHOST network 95, the MC is the master, and the I/O modules are slaves.

The I/O module 98 is comprised of a plurality of I/O units 100 that are connected to component elements (hereinafter referred to as "end devices") of the second process ship 12, and transmits control signals to the end devices and output signals from the end devices. Examples of the end devices connected to the I/O units 100 of the I/O module 98 are: in the second processing unit 34, the MFC in the ammonia gas supply pipe 57, the MFC in the hydrogen fluoride gas supply pipe 58; the pressure gauge 59, and the APC valve 42; in the third processing unit 36, the MFC in the nitrogen gas supply pipe 65, the pressure gauge 66, the APC valve 69, the buffer arm 52, and the stage heater 51; in the second load lock unit 49, the MFC in the nitrogen gas supply pipe 71, the pressure gauge 72, and the second transfer arm 37; and in the unit-driving dry air supply system 77, the first solenoid valve 80, and the second solenoid valve 81.

Each of the I/O modules 97 and 99 has a similar construction to the I/O module 98. Moreover, the connection between the I/O module 97 and the MC 90 for the first process ship 11, and the connection between the I/O module 99 and the MC 92 for the loader unit 13 are constructed similarly to the connection between the I/O module 98 and the MC 91 described above, and hence description thereof is omitted.

Each GHOST network 95 is also connected to an I/O board (not shown) that controls input/output of digital signals, analog signals and serial signals to/from the I/O units 100.

In the substrate processing apparatus 10, when carrying out the COR processing on a wafer W, the CPU of the EC 89 implements the COR processing in the second processing unit 34 by sending control signals to desired end devices via the switching hub 93, the MC 91, the GHOST network 95, and the I/O units 100 of the I/O module 98, in accordance with a program corresponding to a recipe for the COR processing.

Specifically, the CPU sends control signals to the MFC in the ammonia gas supply pipe 57 and the MFC in the hydrogen fluoride gas supply pipe 58 so as to adjust the volumetric flow rate ratio between the ammonia gas and the hydrogen fluoride gas in the chamber 38 to a desired value, and sends control signals to the TMP 41 and the APC valve 42 so as to adjust the pressure in the chamber 38 to a desired value. Moreover, at this time, the pressure gauge 59 sends the value of the pressure in the chamber 38 to the CPU of the EC 89 in the form of an output signal, and the CPU determines control parameters for the MFC in the ammonia gas supply pipe 57, the MFC in the hydrogen fluoride gas supply pipe 58, the APC valve 42, and the TMP 41 based on the sent value of the pressure in the chamber 38.

Moreover, when carrying out the PHT processing on a wafer W, the CPU of the EC 89 implements the PHT processing in the third processing unit 36 by sending control signals to desired end devices in accordance with a program corresponding to a recipe for the PHT processing.

Specifically, the CPU sends control signals to the MFC in the nitrogen gas supply pipe 65, and the APC valve 69 so as to adjust the pressure in the chamber 50 to a desired value, and sends control signals to the stage heater 51 so as to adjust the temperature of the wafer W to a desired temperature. Moreover, at this time, the pressure gauge 66 sends the value of the pressure in the chamber 50 to the CPU of the EC 89 in the form of an output signal, and the CPU determines control parameters for the APC valve 69, and the MFC in the nitrogen gas supply pipe 65 based on the sent value of the pressure in the chamber 50.

According to the system controller shown in FIG. 5, the plurality of end devices are not directly connected to the EC 89, but rather the I/O units 100 which are connected to the plurality of end devices are modularized to form the I/O modules, and each I/O module is connected to the EC 89 via an MC and the switching hub 93. As a result, the communication system can be simplified.

Moreover, each of the control signals sent by the CPU of the EC 89 contains the address of the I/O unit 100 connected to the desired end device, and the address of the I/O module containing that I/O unit 100. The switching hub 93 thus refers to the address of the I/O module in the control signal, and then the GHOST of the appropriate MC refers to the address of the I/O unit 100 in the control signal, whereby the need for the switching hub 93 or the MC to ask the CPU for the destination of the control signal can be eliminated, and hence smoother transmission of the control signals can be realized.

As described earlier, polishing remnants arise on a surface of an insulating film that has been revealed by CMP, and moreover in the case in particular of using a carbon-containing low dielectric constant interlayer insulating film as such an insulating film, a surface damaged layer having similar properties to $SiO_2$ (hereinafter referred to as a "pseudo-$SiO_2$ layer") is formed on the surface of the low dielectric constant interlayer insulating film. Here, the low dielectric constant interlayer insulating film must have a certain mechanical strength, specifically must have a Young's modulus of not less than 4 GPa, so as to not be crushed by the CMP. The pseudo-$SiO_2$ layer and polishing remnants on the surface of an insulating film as described above are a causal factor in various problems with electronic devices manufactured from a wafer W, and hence must be removed. Note that such the pseudo-$SiO_2$ layer is also known as an "altered layer" or a "sacrificial layer".

In the method of processing a substrate according to the present embodiment, to cope with the above, a wafer W having thereon an insulating film on a surface of which polishing remnants have arisen or a pseudo-$SiO_2$ layer has been formed through CMP is subjected to the COR processing and PHT processing.

The COR processing is processing in which an oxide film on an object to be processed is made to undergo chemical reaction with gas molecules to produce a product, and the PHT processing is processing in which the object that has been subjected to the COR processing is heated so as to vaporize/thermally oxidize the product that has been produced on the object to be processed through the chemical reaction in the COR processing, thus removing the product from the substrate. As described above, the COR processing and also the PHT processing are (particularly the COR processing is) processing in which the oxide film on the object to be processed can be removed without using plasma and without using water, and hence are categorized as plasma-less etching or dry cleaning.

In the method of processing a substrate according to the present embodiment, ammonia gas and hydrogen fluoride gas are used as the gas. Here, the hydrogen fluoride gas promotes corrosion of the $SiO_2$ layer or pseudo-$SiO_2$ layer, and the ammonia gas is involved in synthesis of a reaction by-product for restricting, and ultimately stopping, the reaction between the oxide film and the hydrogen fluoride gas as required. Specifically, the following chemical reactions are used in the COR processing and the PHT processing, whereby an upper layer of an $SiO_2$ insulating film is removed so as to remove polishing remnants on the surface of the insulating film, or a pseudo-$SiO_2$ layer formed on the surface of a low dielectric constant interlayer insulating film is removed.

(COR Processing)

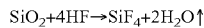

$$SiO_2 + 4HF \rightarrow SiF_4 + 2H_2O\uparrow$$

$$SiF_4 + 2NH_3 + 2HF \rightarrow (NH_4)_2SiF_6$$

(PHT Processing)

$$(NH_4)_2SiF_6 \rightarrow SiF_4\uparrow + 2NH_3\uparrow + 2HF\uparrow$$

It has been found by the present inventors that the COR processing and PHT processing using the above chemical reactions exhibit the following characteristics. Incidentally, small amounts of $N_2$ and $H_2$ are also produced in the PHT processing.

1) Selectivity (Removal Rate) for Thermal Oxide Film is High

Specifically, according to the COR processing and PHT processing, the selectivity for a thermal oxide film is high, whereas the selectivity for silicon is low. The upper layer of the insulating film comprised of an $SiO_2$ film, which is a thermal oxide film, or the pseudo-$SiO_2$ layer, which has similar properties to such an $SiO_2$ film, can thus be removed efficiently.

2) Rate of Growth of Native Oxide Film on Surface of Insulating Film from Which Upper Layer or Pseudo-$SiO_2$ Layer has Been Removed is Slow Specifically, the time taken for growth of a native oxide film of thickness 3 Å on the surface of an insulating film from which the upper layer has been removed by wet etching is 10 minutes, whereas the time taken for growth of a native oxide film of thickness 3 Å on the surface of an insulating film from which the upper layer has been removed by the COR processing and PHT processing is over 2 hours. There is thus no unwanted oxide film formation in an electronic device manufacturing process, and hence the reliability of the electronic device can be improved.

3) Reaction Proceeds in Dry Environment

Specifically, water is not used in the reaction in the COR processing, and moreover any water produced through the COR processing is vaporized in the PHT processing. There are thus no OH groups on the surface of the insulating film from which the upper layer has been removed. The surface of the insulating film thus does not become hydrophilic, and hence the surface does not absorb moisture. A decrease in electronic device wiring reliability can thus be prevented.

4) Amount Produced of Product Levels Off After a Certain Time has Elapsed

Specifically, once a certain time has elapsed, even if the insulating film continues to be exposed to the mixed gas of ammonia gas and hydrogen fluoride gas beyond this, there is no further increase in the amount produced of the product. Moreover, the amount produced of the product is determined by parameters of the mixed gas such as the pressure of the mixed gas and the volumetric flow rate ratio. Control of the amount removed of the insulating film can thus be carried out easily.

5) Very Little Particle Formation

Specifically, even upon implementing insulating film upper layer removal for 2000 wafers W in the second processing unit 34 and the third processing unit 36, hardly any attachment of particles to the inner wall of the chamber 38 or the chamber 50 is observed. Problems due to particles such as short-circuiting of the electronic device wiring thus do not occur, and hence the reliability of the electronic device can be improved.

FIGS. 6A to 6D constitute a process diagram showing the method of processing a substrate according to the present embodiment.

Figure 6A:
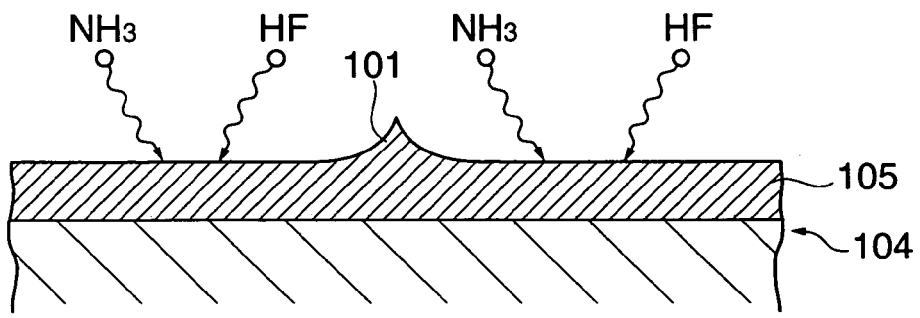
FIGS. 6A to 6D constitute a process diagram showing the method of processing a substrate according to the above embodiment.
Figure 6B:
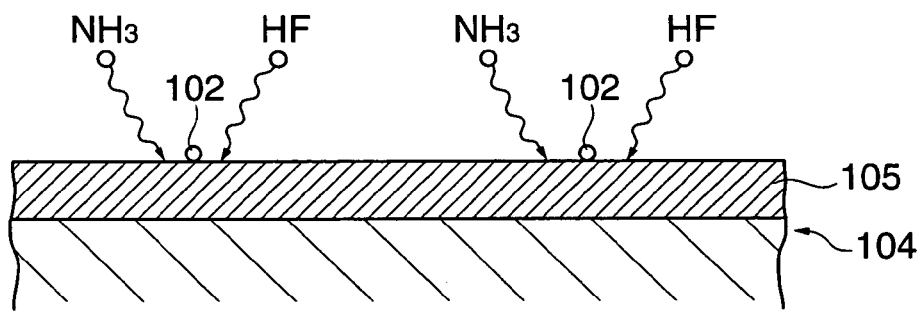
Figure 6C:
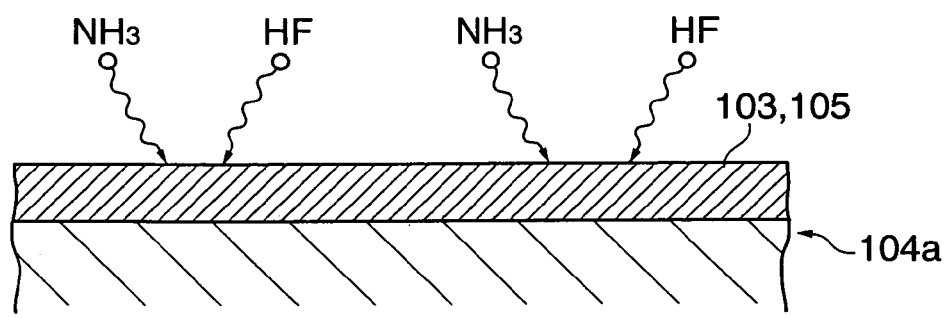

As shown in FIGS. 6A to 6D, first, a wafer W having thereon either an $SiO_2$ insulating film 104 having unpolished portions 101 (FIG. 6A), reaction product 102 (FIG. 6B) or residue (not shown) due to CMP on a surface thereof, or else an SiOCH insulating film 104a having a pseudo-$SiO_2$ layer 103 formed on a surface thereof (FIG. 6C) is housed in the chamber 38 of the second processing unit 34, the pressure in the chamber 38 is adjusted to a predetermined pressure, ammonia gas, hydrogen fluoride gas, and argon (Ar) gas as a diluent gas are introduced into the chamber 38 to produce an atmosphere of a mixed gas comprised of ammonia gas, hydrogen fluoride gas and argon gas in the chamber 38, and the insulating film 104 or 104a is exposed to the atmosphere of the mixed gas under the predetermined pressure (insulating film exposure step) (FIG. 6A, 6B, or 6C). As a result, a product having a complex structure is produced from the $SiO_2$ constituting the insulating film 104 or the pseudo-$SiO_2$ layer 103, the ammonia gas and the hydrogen fluoride gas, whereby the upper layer of the insulating film 104 or the pseudo-$SiO_2$ layer 103 is altered into a product layer 105 made of the product.

Figure 6D:
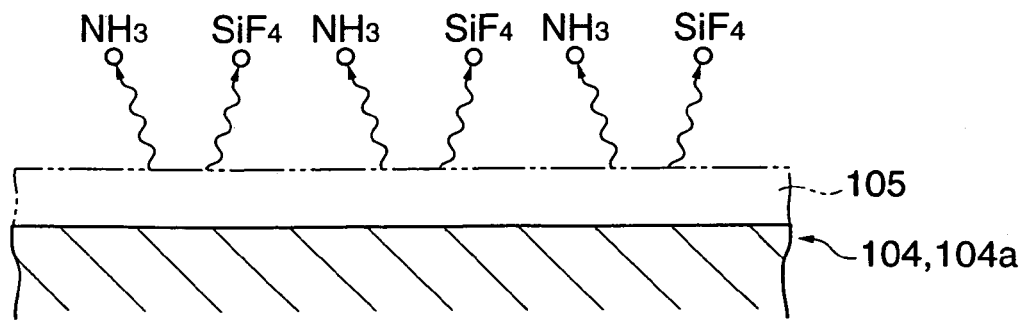

Next, the wafer W on which the product layer 105 has been formed is mounted on the stage heater 51 in the chamber 50 of the third processing unit 36, the pressure in the chamber 50 is adjusted to a predetermined pressure, nitrogen gas is introduced into the chamber 50 to produce viscous flow, and the wafer W is heated to a predetermined temperature using the stage heater 51 (insulating film heating step). At this time, the complex structure of the product layer 105 is thermally decomposed, the product being separated into silicon tetrafluoride ($SiF_4$), ammonia, nitrogen, and hydrogen fluoride, which are vaporized. The vaporized molecules are entrained in the viscous flow, and thus discharged from the chamber 50 by the third processing unit exhaust system 67. As a result, either the upper layer of the insulating film 104 is removed and hence the unpolished portions 101, reaction product 102, and residue on the surface of the insulating film 104 are removed, or else the pseudo-$SiO_2$ layer 103 is removed (FIG. 6D).

In the second processing unit 34, because hydrogen fluoride gas readily reacts with moisture, it is preferable to set the volume of the ammonia gas to be greater than the volume of the hydrogen fluoride gas in the chamber 38, and moreover it is preferable to remove water molecules from the chamber 38 as much as possible. Specifically, the volumetric flow rate (SCCM) ratio of the hydrogen fluoride gas to the ammonia gas in the mixed gas in the chamber 38 is preferably in a range of 1 to 1/2, and moreover the predetermined pressure in the chamber 38 is preferably in a range of $6.7\times10^{-2}$ to 4.0 Pa (0.5 to 30 mTorr). As a result, the flow rate ratio for the mixed gas in the chamber 38 and so on is stabilized, and hence production of the product can be promoted.

Moreover, if the predetermined pressure in the chamber 38 is in a range of $6.7\times10^{-2}$ to 4.0 Pa (0.5 to 30 mTorr), then the amount produced of the product can be made to level off reliably after a certain time has elapsed, whereby the etching depth can be reliably controlled (i.e. is self-limited). For example, in the case that the predetermined pressure in the chamber 38 is 1.3 Pa (10 mTorr), the etching stops proceeding after approximately 3 minutes has elapsed from commencement of the COR processing, and the etching depth at this time is approximately 15 nm. Moreover, in the case that the predetermined pressure in the chamber 38 is 2.7 Pa (20 mTorr), the etching stops proceeding after approximately 3 minutes has elapsed from commencement of the COR processing, and the etching depth at this time is approximately 24 nm.

Moreover, the reaction to produce the product is promoted at around room temperature, and hence the temperature of the ESC 39 on which the wafer W is mounted is preferably set to 25° C. using the temperature adjusting mechanism (not shown) built therein. Furthermore, the higher the temperature, the less prone by-products formed in the chamber 38 are to become attached to the inner wall of the chamber 38, and hence the temperature of the inner wall of the chamber 38 is preferably set to 50° C. using the heater (not shown) embedded in the side wall of the chamber 38.

The product of the reaction is a complex compound containing coordinate bonds. Such a complex compound is weakly bonded together, and hence undergoes thermal decomposition even at a relatively low temperature. In the third processing unit 36, the predetermined temperature of the wafer W is thus preferably in a range of 80 to 200° C., and furthermore the time for which the wafer W is subjected to the PHT processing is preferably in a range of 60 to 180 seconds. Moreover, to produce viscous flow in the chamber 50, it is undesirable to make the degree of vacuum in the chamber 50 high, and moreover a gas flow of a certain flow rate is required. The predetermined pressure in the chamber 50 is thus preferably in a range of $6.7 \times 10$ to $1.3 \times 10^2$ Pa (500 mTorr to 1 Torr), and the nitrogen gas flow rate is preferably in a range of 500 to 3000 SCCM. As a result, viscous flow can be produced reliably in the chamber 50, and hence gas molecules produced through the thermal decomposition of the product can be reliably removed.

Moreover, before subjecting each wafer W to the COR processing, it is preferable to measure the surface shape of the insulating film 104 or 104a, for example the film thickness, or a CD value of the shape of a wiring groove, a gate electrode or the like, and in accordance with the measured surface shape, for the CPU of the EC 89 to decide the values of processing condition parameters in the COR processing and PHT processing based on a predetermined relationship between the surface shape of the insulating film and processing condition parameters relating to the amount removed of the upper layer of the insulating film or the amount removed of the pseudo-$SiO_2$ layer (product production condition deciding step). As a result, the amount removed of the upper layer of the insulating film 104, and hence the amount removed of the unpolished portions 101, reaction product 102, and residue on the surface of the insulating film 104, can be controlled precisely, or the amount removed of the pseudo-$SiO_2$ layer 103 can be controlled precisely. The efficiency of the substrate surface processing can thus be improved. Furthermore, when removing some of the insulating film 104 so as to eliminate local erosion of the insulating film 104 that has arisen due to the CMP, the amount removed of the insulating film 104 can be controlled precisely, and hence re-flattening of the insulating film 104 can be carried out precisely.

The above predetermined relationship is set based on the difference in the surface shape of the insulating film 104 or 104a between before and after carrying out the COR processing and PHT processing as measured by the first IMS 17 at the start of a lot in which a plurality of wafers W are to be processed, i.e. the amount removed of the upper layer of the insulating film 104 or the amount removed of the pseudo-$SiO_2$ layer 103 by the COR processing and PHT processing, and the processing condition parameters in the COR processing and PHT processing at this time. Examples of the processing condition parameters include the volumetric flow rate ratio of the hydrogen fluoride gas to the ammonia gas, the predetermined pressure in the chamber 38, and the heating temperature of the wafer W mounted on the stage heater 51. The predetermined relationship thus set is stored in the HDD of the EC 89 or the like, and is referred to as described above when processing subsequent wafers W in the lot.

Moreover, whether or not to re-perform the COR processing and PHT processing on a wafer W may be decided based on the difference in the surface shape of the insulating film 104 or 104a between before and after performing the COR processing and PHT processing on that wafer W, and furthermore in the case that it is decided to re-perform the COR processing and PHT processing, the CPU of the EC 89 may decide the processing condition parameters for the COR processing and PHT processing based on the above predetermined relationship in accordance with the surface shape of the insulating film 104 or 104a after carrying out the COR processing and PHT processing on the wafer W in question the first time. As a result, the amount removed of the insulating film 104 or 104a can be controlled precisely, and hence re-flattening of the insulating film 104 or 104a can be carried out precisely.

According to the method of processing a substrate of the present embodiment, a wafer W having thereon either an insulating film 104 having unpolished portions 101, reaction product 102, and residue on a surface thereof, or else an insulating film 104a having a pseudo-$SiO_2$ layer 103 formed on a surface thereof is exposed to an atmosphere of a mixed gas comprised of ammonia gas, hydrogen fluoride gas and argon gas under a predetermined pressure, and then the wafer W that has been exposed to the atmosphere of the mixed gas is heated to a predetermined temperature. As a result, a product having a complex structure is produced from the $SiO_2$ constituting the insulating film 104 or the pseudo-$SiO_2$ layer 103, the ammonia gas and the hydrogen fluoride gas, and then the complex structure of the product is thermally decomposed, the product being separated into silicon tetrafluoride, ammonia and hydrogen fluoride, which are vaporized. Through the product being vaporized, an upper layer of the insulating film 104 can be removed so as to remove the unpolished portions 101, reaction product 102, and residue on the surface of the insulating film 104, or else the pseudo-$SiO_2$ layer 103 can be removed. At this time, the amount produced of the product levels off after a certain time has elapsed, and moreover the amount produced of the product can be controlled through parameters of the mixed gas. Control of the amount removed of the unpolished portions 101, reaction product 102, and residue on the surface of the insulating film 104, or control of the amount removed of the pseudo-$SiO_2$ layer 103 can thus be carried out easily.

Moreover, according to the method of processing a substrate of the present embodiment, the unpolished portions 101, reaction product 102, and residue are, or the pseudo-$SiO_2$ layer 103 is, removed by subjecting the wafer W to plasma-less etching. As a result, charge is not accumulated on a gate electrode in an electronic device manufactured from the wafer W, and hence degradation or destruction of a gate oxide film can be prevented. Moreover, the electronic device is not irradiated with energetic particles, and hence semiconductor crystal defects can be prevented from occurring. Furthermore, unanticipated chemical reactions caused by plasma do not occur, and hence generation of impurities can be prevented, whereby contamination of the chamber 38 and the chamber 50 can be prevented.

Furthermore, according to the method of processing a substrate of the present embodiment, the unpolished portions 101, reaction product 102, and residue are, or the pseudo-$SiO_2$ layer 103 is, removed by subjecting the wafer W to dry cleaning. As a result, surface roughness of the wafer W can be prevented from occurring, and moreover changes in properties of the surface of the wafer W can be suppressed, and hence a decrease in wiring reliability in an electronic device manufactured from the wafer W can be reliably prevented.

Next, a post-chemical mechanical polishing cleaning method according to an embodiment of the present invention will be described.

In the post-chemical mechanical polishing cleaning method according to the present embodiment, a pseudo-$SiO_2$ layer and polishing remnants on a surface of an insulating film are removed using the COR processing and PHT processing as described above. The COR processing and the PHT processing are implemented in the second process ship 12 of the substrate processing apparatus 10.

FIGS. 7A to 7E constitute a process diagram showing the post-chemical mechanical polishing cleaning method according to the present embodiment.

Figure 7A:
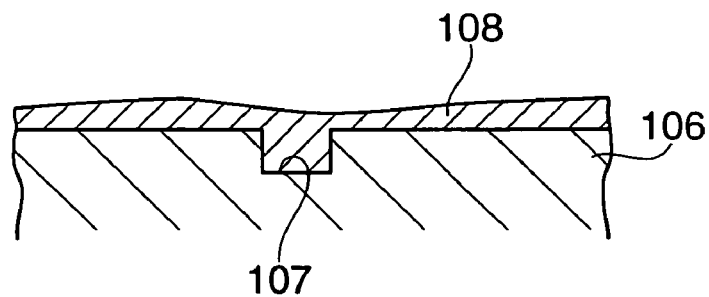
FIGS. 7A to 7E constitute a process diagram showing a post-chemical mechanical polishing cleaning method according to an embodiment of the present invention.

As shown in FIGS. 7A to 7E, first, a wiring groove 107 is formed by RIE or the like in an $SiO_2$ insulating film 106 that has been formed by thermal oxidation on a surface of a wafer W, and then a conductive film 108 is formed by depositing polysilicon, which is a conductive material, on the insulating film 106 by PVD or CVD (chemical vapor deposition) (FIG. 7A).

Figure 7B:
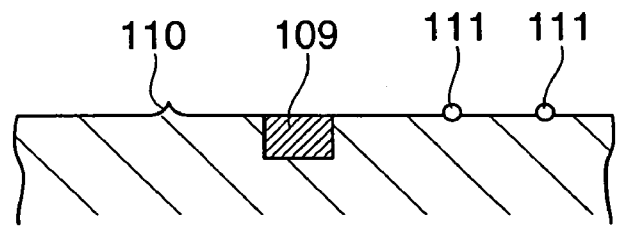

Next, the conductive film 108 is polished away by CMP so as to reveal the insulating film 106, whereby wiring 109 is formed. At this time, unpolished portions 110, reaction product 111, and residue (not shown) are formed through the CMP on the surface of the revealed insulating film 106 (FIG. 7B).

Figure 7C:
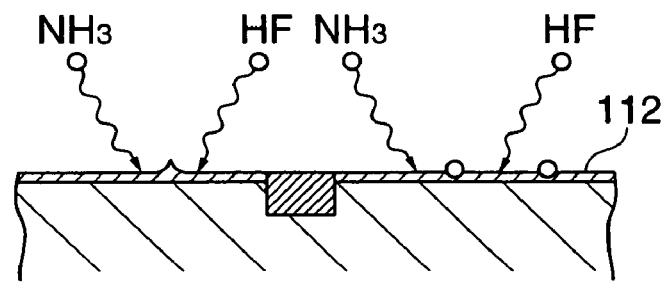

Next, the wafer W having thereon the insulating film 106 having the unpolished portions 110, reaction product 111, and residue on the surface thereof is transferred into a drying furnace (not shown) and the surface of the insulating film 106 is dried, and then the wafer W having thereon the insulating film 106 of which the surface has been dried is housed in the chamber 38 of the second processing unit 34, the pressure in the chamber 38 is adjusted to a predetermined pressure, ammonia gas, hydrogen fluoride gas, and argon gas are introduced into the chamber 38 to produce an atmosphere of a mixed gas comprised of ammonia gas, hydrogen fluoride gas and argon gas in the chamber 38, and the insulating film 106 is exposed to the atmosphere of the mixed gas under the predetermined pressure (insulating film exposure step). As a result, a product having a complex structure is produced from the $SiO_2$ constituting the insulating film 106, the ammonia gas and the hydrogen fluoride gas, whereby an upper layer of the insulating film 106 is altered into a product layer 112 made of the product (FIG. 7C).

Figure 7D:
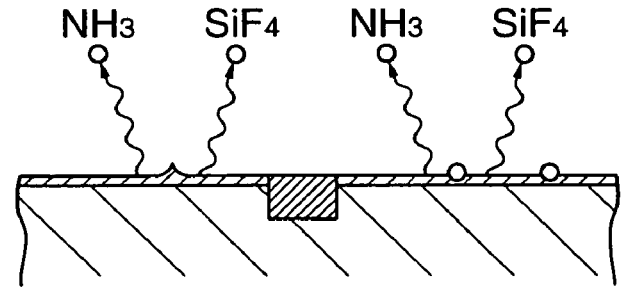
Figure 7E:
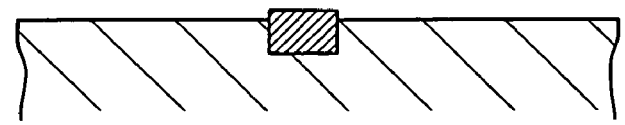

Next, the wafer W on which the product layer 112 has been formed is mounted on the stage heater 51 in the chamber 50 of the third processing unit 36, the pressure in the chamber 50 is adjusted to a predetermined pressure, nitrogen gas is introduced into the chamber 50 to produce viscous flow, and the wafer W is heated to a predetermined temperature using the stage heater 51 (insulating film heating step). At this time, the complex structure of the product of the product layer 112 is thermally decomposed, the product being separated into silicon tetrafluoride ($SiF_4$), ammonia, nitrogen, and hydrogen fluoride, which are vaporized (FIG. 7D). The vaporized molecules are entrained in the viscous flow, and thus discharged from the chamber 50 by the third processing unit exhaust system 67. As a result, the upper layer of the insulating film 106 is removed, whereby the unpolished portions 110, reaction product 111, and residue on the surface of the insulating film 106 are removed together with the upper layer of the insulating film 106 (FIG. 7E).

According to the post-chemical mechanical polishing cleaning method of the present embodiment, a wafer W having thereon an insulating film 106 having unpolished portions 110, reaction product 111, and residue on a surface thereof due to CMP is exposed to an atmosphere of a mixed gas comprised of ammonia gas, hydrogen fluoride gas and argon gas under a predetermined pressure, and then the wafer W that has been exposed to the atmosphere of the mixed gas is heated to a predetermined temperature. As a result, a product having a complex structure is produced from the $SiO_2$ constituting the insulating film 106, the ammonia gas and the hydrogen fluoride gas, and then the complex structure of the product is thermally decomposed, the product being separated into silicon tetrafluoride, ammonia and hydrogen fluoride, which are vaporized. Through the product being vaporized, an upper layer of the insulating film 106 can be removed so as to remove the unpolished portions 110, reaction product 111, and residue on the surface of the insulating film 106. At this time, the amount produced of the product can be controlled through parameters of the mixed gas. Control of the amount removed of the unpolished portions 110, reaction product 111, and residue on the surface of the insulating film 106 can thus be carried out easily.

Moreover, according to the post-chemical mechanical polishing cleaning method of the present embodiment, before the revealed insulating film 106 is exposed to the atmosphere of the mixed gas, the surface of the revealed insulating film 106 is dried. The production of the product thus proceeds under a dry environment, whereby the production of the product can be promoted, and then, the removal of the unpolished portions 110, reaction product 111, and residue can be promoted.

In the post-chemical mechanical polishing cleaning method according to the present embodiment described above, polishing remnants on the surface of an insulating film are removed. However, in the case that an SiOCH low dielectric constant interlayer insulating film is used as the insulating film, a pseudo-$SiO_2$ layer formed on the surface of the low dielectric constant interlayer insulating film through the CMP can also be removed by exposing the pseudo-$SiO_2$ layer to the atmosphere of the mixed gas so as to alter the pseudo-$SiO_2$ layer into a product layer, and then thermally vaporizing the product layer.

Next, a method of manufacturing an electronic device according to an embodiment of the present invention will be described.

In the method of manufacturing an electronic device according to the present embodiment, a pseudo-$SiO_2$ layer and polishing remnants on a surface of a low dielectric constant interlayer insulating film are removed using the COR processing and PHT processing as described above. The COR processing and the PHT processing are implemented in the second process ship 12 of the substrate processing apparatus 10.

FIGS. 8A to 8J constitute a process diagram showing the method of manufacturing an electronic device according to the present embodiment.

Figure 8A:
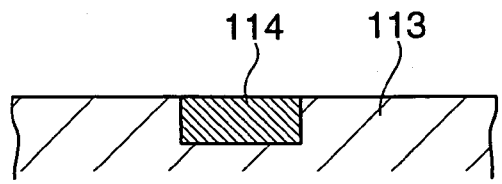
FIGS. 8A to 8J constitute a process diagram showing a method of manufacturing an electronic device according to an embodiment of the present invention.

As shown in FIGS. 8A to 8J, first, a wiring groove is formed by RIE or the like in an $SiO_2$ insulating film 113 (first insulating film) that has been formed by thermal oxidation on a surface of a wafer W, and then a conductive film (not shown) made of aluminum (Al) or an aluminum alloy (first conductive material) is formed on the insulating film 113. Flattening processing such as etch back is further carried out, and then the formed conductive film is polished away so as to reveal the insulating film 113, whereby wiring 114 is formed in the insulating film 113 (wiring formation step) (FIG. 8A).

Figure 8B:
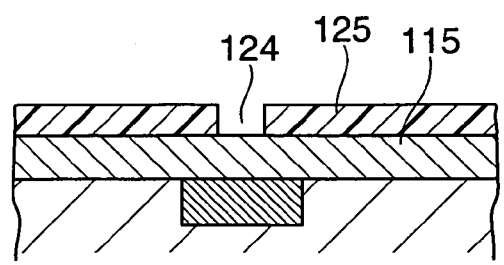

Next, an SiOCH low dielectric constant interlayer insulating film 115 (second insulating film) is formed on the insulating film 113 by CVD so as to cover the wiring 114 (second insulating film formation step), and then a photoresist layer 125 patterned such as to have therein an opening 124 through which part of the low dielectric constant interlayer insulating film 115 directly above the wiring 114 will be exposed is formed by lithography (photoresist layer formation step) (FIG. 8B).

Figure 8C:
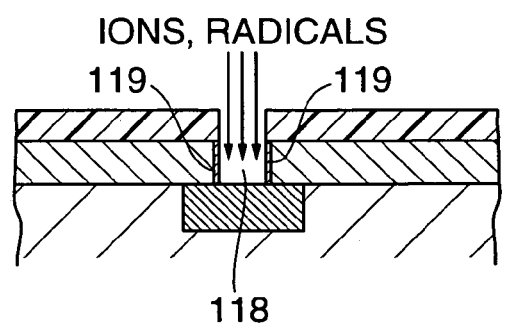

Next, using the formed photoresist layer 125 as a mask, the low dielectric constant interlayer insulating film 115 is etched by RIE, thus fabricating in the low dielectric constant interlayer insulating film 115 a via hole (connecting hole) 118 that reaches the wiring 114 (plasma fabrication step) (FIG. 8C). At this time, a surface of the via hole 118 is covered by a damaged layer 119 (surface damaged layer) having a reduced carbon concentration due to the RIE.

Figure 8D:
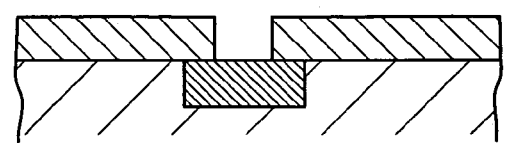
Figure 8E:
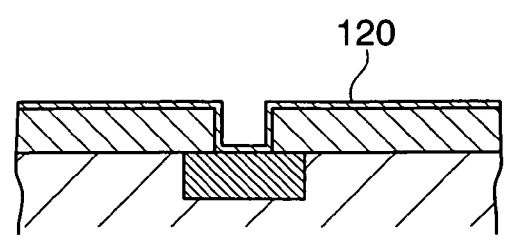

After that, the wafer W is housed in the chamber 38 of the second processing unit 34, and the surface of the via hole 118 is exposed to an atmosphere of a mixed gas comprised of ammonia gas, hydrogen fluoride gas and argon gas under a predetermined pressure (connecting hole surface exposure step), and then the wafer W that has been exposed to the atmosphere of the mixed gas is mounted on the stage heater 51 in the chamber 50 of the third processing unit 36, and the surface of the via hole 118 is heated to a predetermined temperature (connecting hole surface heating step). As a result, the damaged layer 119 is altered into a product layer, and then the product layer is thermally vaporized, thus removing the damaged layer 119 covering the surface of the via hole 118. The wafer W is then taken out from the third processing unit 36, and the photoresist layer 125 is removed by ashing or the like (ashing step) (FIG. 8D).

Figure 8F:
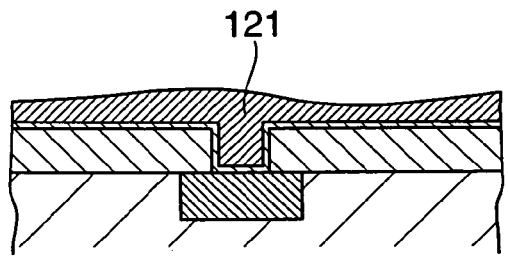

Next, the surface of the low dielectric constant interlayer insulating film 115, including the surface of the via hole 118 from which the damaged layer 119 has been removed, is coated with a conductive barrier film 120 made of silicon nitride (SiN) or silicon carbide (SiC) (connecting hole coating step) (FIG. 8E), and then copper (Cu) (a second conductive material) is deposited by CVD or PVD on the low dielectric constant interlayer insulating film 115 that has been coated with the conductive barrier film 120, thus forming a copper conductive film 121, and moreover filling the via hole 118 with copper (connecting hole filling step) (FIG. 8F).

Figure 8G:
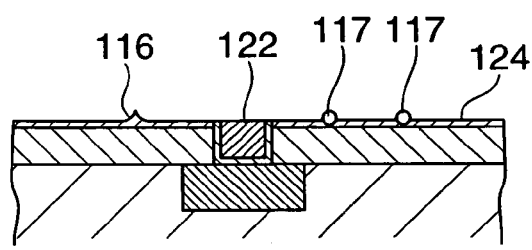

Next, the conductive film 121 and the conductive barrier film 120 are polished away by CMP so as to reveal the low dielectric constant interlayer insulating film 115 (conductive film polishing step), whereby a via fill 122 is formed. At this time, a pseudo-SiO$_2$ layer 124 due to the CMP is formed on the surface of the revealed low dielectric constant interlayer insulating film 115, and unpolished portions 116, reaction product 117, and residue (not shown) due to the CMP are formed on the pseudo-SiO$_2$ layer 124 (FIG. 8G).

Figure 8H:
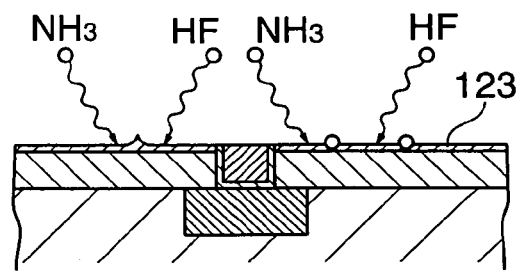

Next, the wafer W having thereon the low dielectric constant interlayer insulating film 115 having the unpolished portions 116, reaction product 117, and residue, and the pseudo-SiO$_2$ layer 124 on the surface thereof is housed in the chamber 38 of the second processing unit 34, the pressure in the chamber 38 is adjusted to a predetermined pressure, ammonia gas, hydrogen fluoride gas, and argon gas are introduced into the chamber 38 to produce an atmosphere of a mixed gas comprised of ammonia gas, hydrogen fluoride gas and argon gas in the chamber 38, and the low dielectric constant interlayer insulating film 115 is exposed to the atmosphere of the mixed gas under the predetermined pressure (second insulating film exposure step). As a result, a product having a complex structure is produced from the pseudo-SiO$_2$ layer, the ammonia gas and the hydrogen fluoride gas, whereby the pseudo-SiO$_2$ layer 124 is altered into a product layer 123 made of the product (FIG. 8H).

Figure 8I:
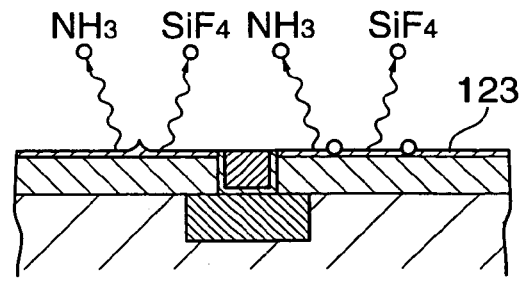
Figure 8J:
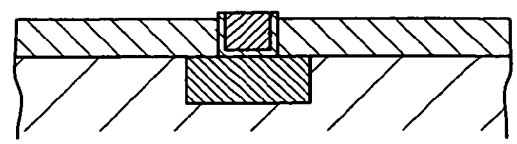

Next, the wafer W on which the product layer 123 has been formed is mounted on the stage heater 51 in the chamber 50 of the third processing unit 36, the pressure in the chamber 50 is adjusted to a predetermined pressure, nitrogen gas is introduced into the chamber 50 to produce viscous flow, and the wafer W is heated to a predetermined temperature using the stage heater 51 (insulating film heating step). At this time, the complex structure of the product in the product layer 123 is thermally decomposed, the product being separated into silicon tetrafluoride, ammonia and hydrogen fluoride, which are vaporized (FIG. 8I). The vaporized molecules are entrained in the viscous flow, and thus discharged from the chamber 50 by the third processing unit exhaust system 67. As a result, the pseudo-SiO$_2$ layer 124 is removed, and furthermore the unpolished portions 116, reaction product 117, and residue on the pseudo-SiO$_2$ layer 124 are also removed (FIG. 8J).

According to the method of manufacturing an electronic device of the present embodiment, a wafer W having thereon a low dielectric constant interlayer insulating film 115 having unpolished portions 116, reaction product 117, and residue, and a pseudo-SiO$_2$ layer 124 due to CMP on a surface thereof is exposed to an atmosphere of a mixed gas comprised of ammonia gas, hydrogen fluoride gas and argon gas under a predetermined pressure, and then the wafer W that has been exposed to the atmosphere of the mixed gas is heated to a predetermined temperature. As a result, a product having a complex structure is produced from the pseudo-SiO$_2$ layer, the ammonia gas and the hydrogen fluoride gas, and then the complex structure of the product is thermally decomposed, the product being separated into silicon tetrafluoride, ammonia and hydrogen fluoride, which are vaporized. Through the product being vaporized, the pseudo-SiO$_2$ layer 124 can be removed, and furthermore the unpolished portions 116, reaction product 117, and residue on the pseudo-SiO$_2$ layer 124 can also be removed. At this time, the amount produced of the product can be controlled through parameters of the mixed gas. Control of the amount removed of the pseudo-SiO$_2$ layer 124, and control of the amount removed of the unpolished portions 116, reaction product 117, and residue on the pseudo-SiO$_2$ layer 124 can thus be carried out easily.

Moreover, according to the method of manufacturing an electronic device of the present embodiment, a surface of a via hole 118 fabricated in the low dielectric constant interlayer insulating film 115 is exposed to an atmosphere of a mixed gas containing ammonia and hydrogen fluoride under a predetermined pressure. As a result, a product is produced on the surface of the via hole 118, and then the product is vaporized by heating, whereby a damaged layer 119 on the via hole 118 produced due to RIE can be removed, and hence wiring delay due to the damaged layer 119 can be prevented from occurring.

Furthermore, according to the method of manufacturing an electronic device of the present embodiment, the surface of the via hole 118 from which the damaged layer 119 has been removed by heating to a predetermined temperature is coated with a conductive barrier film 120. As a result, the surface of the via hole 118, and copper filled into the via hole 118 can be prevented from coming into contact with one another, whereby diffusion of the copper into the low dielectric constant interlayer insulating film 115 can be prevented.

In the method of manufacturing an electronic device shown in FIGS. 8A to 8J described above, the photoresist layer 125 is removed before the via hole 118 is filled with copper. However, the photoresist layer 125 may be removed after the via hole 118 has been filled with copper, for example the photoresist layer 125 may be polished away by the CMP when polishing away the conductive film 121 and the conductive barrier film 120 by CMP. As a result, the throughput can be improved.

In the post-chemical mechanical polishing cleaning method or the method of manufacturing an electronic device according to the present embodiments described above, before removing the upper layer of an insulating film and/or a pseudo-$SiO_2$ layer, it is preferable to transfer the wafer W into the first IMS 17 and measure the surface shape of the insulating film, and in accordance with the measured surface shape, for the CPU of the EC 89 to decide target values of processing condition parameters relating to the amount removed of the upper layer of the insulating film or the amount removed of the pseudo-$SiO_2$ layer, such as the volumetric flow rate ratio of the hydrogen fluoride gas to the ammonia gas, the predetermined pressure in the chamber 38, and the heating temperature of the wafer W mounted on the stage heater 51, based on a predetermined relationship between the surface shape of the insulating film and these processing condition parameters. As a result, the amount removed of the upper layer of the insulating film can be controlled precisely so as to precisely control the amount removed of polishing remnants on the surface of the insulating film, or else the amount removed of the pseudo-$SiO_2$ layer can be controlled precisely; the efficiency of the manufacture of the electronic device can thus be improved. Furthermore, when removing some of the insulating film so as to eliminate local erosion of the insulating film that has arisen due to the CMP, the amount removed of the insulating film can be controlled precisely, and hence re-flattening can be carried out precisely.

Moreover, whether or not to re-perform the removal of the upper layer of the insulating film or the like may be decided based on the difference in the surface shape of the insulating film between before and after performing the removal of the upper layer of the insulating film or the like, and furthermore in the case that it is decided to re-perform the removal of the upper layer of the insulating film or the like, the CPU of the EC 89 may decide the volumetric flow rate ratio of the hydrogen fluoride gas to the ammonia gas and so on, or may decide to re-perform the polishing by CMP, based on the above predetermined relationship in accordance with the surface shape of the insulating film after carrying out the removal of the upper layer of the insulating film or the like the first time. As a result, the amount removed of the upper layer of the insulating film or the like when re-performing the removal can be controlled precisely, and hence re-flattening of the upper layer of the insulating film or the like can be carried out precisely.

Figure 9:
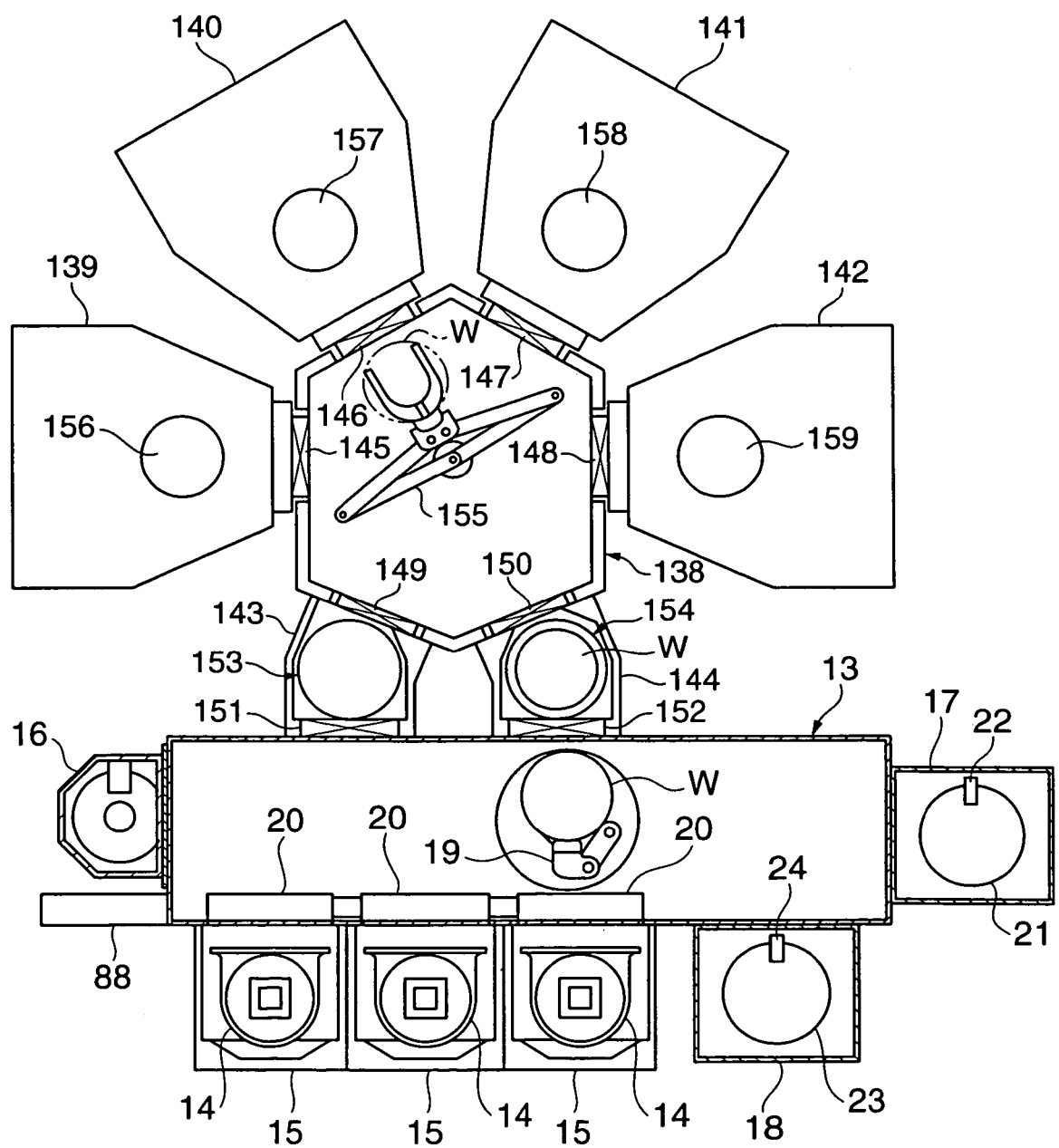
FIG. 9 is a plan view schematically showing the construction of a first variation of the substrate processing apparatus to which is applied the method of processing a substrate according to the above embodiment.
Figure 10:
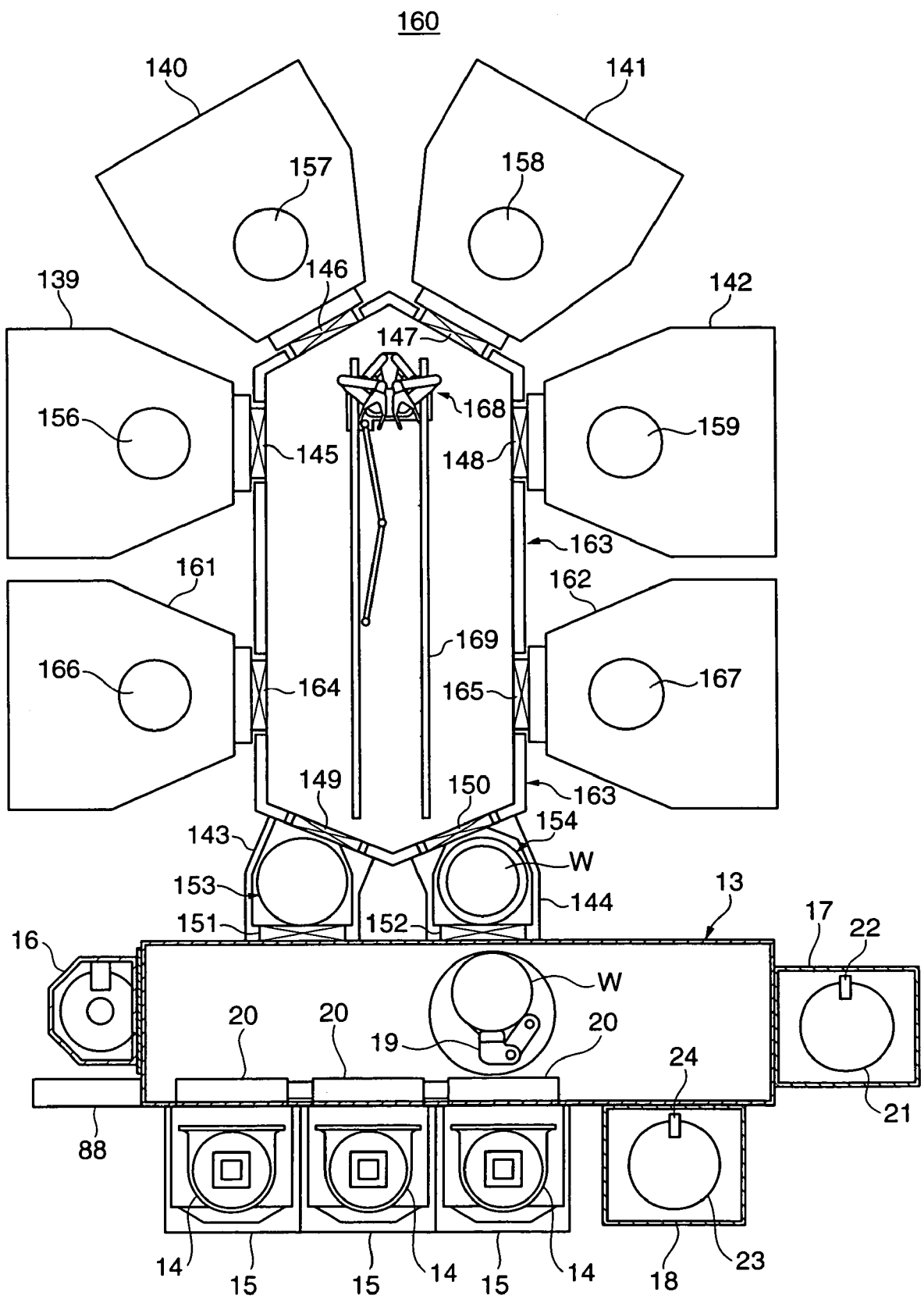
FIG. 10 is a plan view schematically showing the construction of a second variation of the substrate processing apparatus to which is applied the method of processing a substrate according to the above embodiment.
Figure 11:
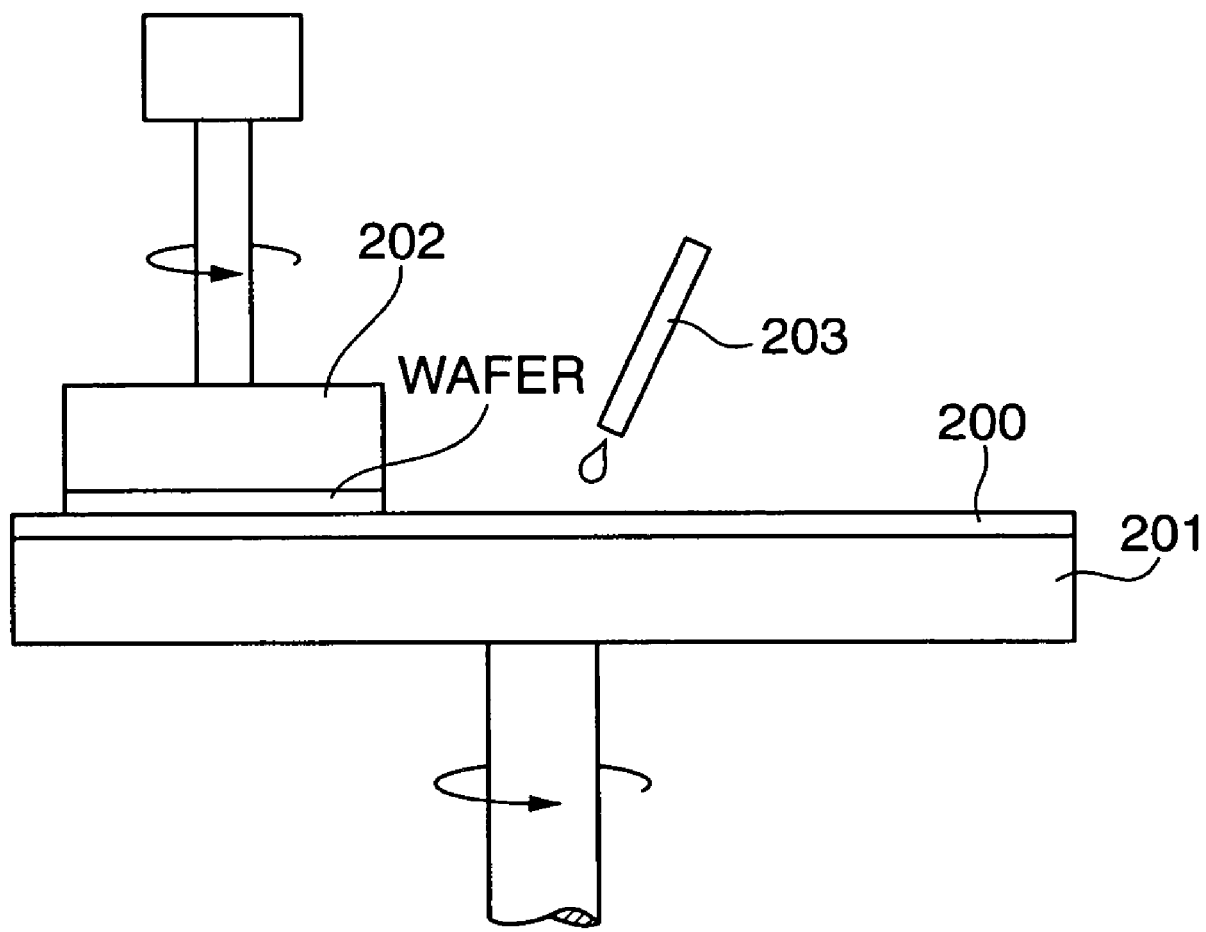
FIG. 11 is a view schematically showing the construction of a polishing apparatus for carrying out CMP on a wafer.

The substrate processing apparatus to which is applied the method of processing a substrate according to the above embodiment is not limited to being a substrate processing apparatus of a parallel type having two process ships arranged in parallel with one another as shown in FIG. 1, but rather as shown in FIGS. 9 and 10, the substrate processing apparatus may instead be one having a plurality of processing units arranged in a radial manner as vacuum processing chambers in which predetermined processing is carried out on the wafers W.

FIG. 9 is a plan view schematically showing the construction of a first variation of the substrate processing apparatus to which is applied the method of processing a substrate according to the present invention. In FIG. 9, component elements the same as ones of the substrate processing apparatus 10 shown in FIG. 1 are designated by the same reference numerals as in FIG. 1, and description thereof is omitted here.

As shown in FIG. 9, the substrate processing apparatus 137 is comprised of a transfer unit 138 having a hexagonal plan view, four processing units 139 to 142 arranged in a radial manner around the transfer unit 138, a loader unit 13, and two load lock units 143 and 144 that are each disposed between the transfer unit 138 and the loader unit 13 so as to link the transfer unit 138 and the loader unit 13 together.

The internal pressure of the transfer unit 138 and each of the processing units 139 to 142 is held at vacuum. The transfer unit 138 is connected to the processing units 139 to 142 by vacuum gate valves 145 to 148 respectively.

In the substrate processing apparatus 137, the internal pressure of the loader unit 13 is held at atmospheric pressure, whereas the internal pressure of the transfer unit 138 is held at vacuum. The load lock units 143 and 144 are thus provided respectively with a vacuum gate valve 149 or 150 in a connecting part between that load lock unit and the transfer unit 138, and an atmospheric door valve 151 or 152 in a connecting part between that load lock unit and the loader unit 13, whereby the load lock units 143 and 144 are each constructed as a preliminary vacuum transfer chamber whose internal pressure can be adjusted. Moreover, the load lock units 143 and 144 have respectively therein a wafer mounting stage 153 or 154 for temporarily mounting a wafer W being transferred between the loader unit 13 and the transfer unit 138.

The transfer unit 138 has disposed therein a frog leg-type transfer arm 155 that can bend/elongate and turn. The transfer arm 155 transfers the wafers W between the processing units 139 to 142 and the load lock units 143 and 144.

The processing units 139 to 142 has respectively therein a mounting stage 156 to 159 on which is mounted a wafer W to be processed. Here, the processing unit 140 is constructed like the first processing unit 25 in the substrate processing apparatus 10, the processing unit 141 is constructed like the second processing unit 34 in the substrate processing apparatus 10, and the processing unit 142 is constructed like the third processing unit 36 in the substrate processing apparatus 10. Each of the wafers W can thus be subjected to RIE in the processing unit 140, the COR processing in the processing unit 141, and the PHT processing in the processing unit 142.

In the substrate processing apparatus 137, the method of processing a substrate according to the present invention is implemented by transferring a wafer W having thereon an insulating film having polishing remnants or a pseudo-$SiO_2$ layer on a surface thereof into the processing unit 141 and carrying out the COR processing, and then transferring the wafer W into the processing unit 142 and carrying out the PHT processing.

Moreover, in the substrate processing apparatus 137, the processing unit 139 may be a film formation apparatus (CVD apparatus) for forming an insulating film or the like on the surface of each of the wafers W, and the processing unit 140 may be a polishing apparatus for subjecting each of the wafers W to CMP. In this case, the transfer arm 155 transfers each wafer W into the processing units 139 to 142 in this order, whereby the film formation, CMP, COR, and PHT can be carried out on each wafer W continuously. As a result, the throughput can be improved. Moreover, because each wafer W is not transferred out into the loader unit 13 during this continuous processing, the wafer W does not come into contact with the external atmosphere, and hence formation of an oxide film on the insulating film can be prevented, and moreover attachment of particles onto the surface of the wafer W can be prevented, whereby the wiring reliability for an electronic device manufactured from the wafer W can be improved.

Operation of the component elements in the substrate processing apparatus 137 is controlled using a system controller constructed like the system controller in the substrate processing apparatus 10.

FIG. 10 is a plan view schematically showing the construction of a second variation of the substrate processing apparatus to which is applied the method of processing a substrate according to the present invention. In FIG. 10, component elements the same as ones of the substrate processing apparatus 10 shown in FIG. 1 or the substrate processing apparatus 137 shown in FIG. 9 are designated by the same reference numerals as in FIG. 1 or FIG. 9, and description thereof is omitted here.

As shown in FIG. 10, compared with the substrate processing apparatus 137 shown in FIG. 9, the substrate processing apparatus 160 has an additional two processing units 161 and 162, and the shape of a transfer unit 163 of the substrate processing apparatus 160 is accordingly different to the shape of the transfer unit 138 of the substrate processing apparatus 137. The additional two processing units 161 and 162 are respectively connected to the transfer unit 163 via a vacuum gate valve 164 or 165, and respectively have therein a wafer W mounting stage 166 or 167.

Moreover, the transfer unit 163 has therein a transfer arm unit 168 comprised of two SCARA-type transfer arms. The transfer arm unit 168 moves along guide rails 169 provided in the transfer unit 163, and transfers the wafers W between the processing units 139 to 142, 161 and 162, and the load lock units 143 and 144.

In the substrate processing apparatus 160, as for the substrate processing apparatus 137, the method of processing a substrate according to the present invention is implemented by transferring a wafer W having thereon an insulating film having polishing remnants or a pseudo-$SiO_2$ layer on a surface thereof into the processing unit 141 and carrying out the COR processing, and then transferring the wafer W into the processing unit 142 and carrying out the PHT processing.

Moreover, in the substrate processing apparatus 160, as for the substrate processing apparatus 137, the processing unit 139 (or the processing unit 161) may be a film formation apparatus (CVD apparatus) for forming an insulating film or the like on the surface of each of the wafers W, and the processing unit 140 (or the processing unit 139) may be a polishing apparatus for subjecting each of the wafers W to CMP. In this case, again, the throughput can be improved, and the wiring reliability for an electronic device manufactured from the wafer W can be improved.

Operation of the component elements in the substrate processing apparatus 160 is again controlled using a system controller constructed like the system controller in the substrate processing apparatus 10.

Examples of the electronic device include semiconductor devices, and also non-volatile or high-capacity memory devices having therein a thin film made of an insulating metal oxide material such as a ferroelectric material or a high dielectric material, in particular a material having a perovskite crystal structure. Examples of materials having a perovskite crystal structure include lead zirconate titanate (PZT), barium strontium titanate (BST), and strontium bismuth niobium tantalate (SBNT).

It is to be understood that the object of the present invention can also be attained by supplying to a system or apparatus (the EC 89) a storage medium in which a program code of software that realizes the functions of the above described embodiment is stored, and then causing a computer (or CPU, MPU, or the like) of the system or apparatus (EC 89) to read out and execute the program code stored in the storage medium.

In this case, the program code itself read out from the storage medium realizes the functions of the embodiment described above, and hence the program code and the storage medium in which the program code is stored constitute the present invention.

The storage medium for supplying the program code may be, for example, a floppy (registered trademark) disk, a hard disk, a magnetic-optical disk, a CD-ROM, a CD-R, a CD-RW, a DVD-ROM, a DVD-RAM, a DVD-RW, a DVD+RW, a magnetic tape, a non-volatile memory card, and a ROM. Alternatively, the program code may be downloaded via a network.

Moreover, it is to be understood that the functions of the above described embodiment may be accomplished not only by executing a program code read out by a computer, but also by causing an OS (operating system) or the like which operates on the computer to perform a part or all of the actual operations based on instructions of the program code.

Furthermore, it is to be understood that the functions of the above described embodiment may be accomplished by writing a program code read out from the storage medium into a memory provided on an expansion board inserted into a computer or in an expansion unit connected to the computer or in an expansion unit connected to the computer and then causing a CPU or the like provided on the expansion board or in the expansion unit to perform a part or all of the actual operations based on instructions of the program code.

The form of the program code may be, for example, object code, program code executed by an interpreter, or script data supplied to an OS.

What is claimed is:

1. A method of processing a substrate having thereon an insulating film that has been revealed by chemical mechanical polishing, the method comprising:
    an insulating film exposure step of exposing the revealed insulating film, which has been revealed through the chemical mechanical polishing, to an atmosphere of a mixed gas containing ammonia and hydrogen fluoride under a predetermined pressure; and
    an insulating film heating step of heating to a predetermined temperature the insulating film that has been exposed to the atmosphere of the mixed gas.

2. A method as claimed in claim 1, wherein the revealed insulating film is a low dielectric constant insulating film.

3. A method as claimed in claim 1, wherein in said insulating film exposure step, the substrate is subjected to plasmaless etching.

4. A method as claimed in claim 1, wherein in said insulating film exposure step, the substrate is subjected to dry cleaning.

5. A method as claimed in claim 1, wherein a volumetric flow rate ratio of the hydrogen fluoride to the ammonia in the mixed gas is in a range of 1 to 1/2, and the predetermined pressure is in a range of $6.7 \times 10^{-2}$ to 4.0 Pa.

6. A method as claimed in claim 1, wherein the predetermined temperature is in a range of 80 to 200° C.

7. A method as claimed in claim 1, further comprising:
a product production condition deciding step of measuring a shape of the revealed insulating film, and deciding at least one of the volumetric flow rate ratio of the hydrogen fluoride to the ammonia in the mixed gas and the predetermined pressure in accordance with the measured shape.

8. A method as claimed in claim 1, wherein the revealed insulating film has thereon unpolished portions produced through the chemical mechanical polishing.

9. A method as claimed in claim 1, wherein the revealed insulating film has thereon a reaction product originating from a polishing agent used in the chemical mechanical polishing.

10. A method as claimed in claim 1, wherein the insulating film has thereon a surface damaged layer having a reduced carbon concentration.

11. A method as claimed in claim 1, further comprising:
an insulating film drying step of drying a surface of the revealed insulating film before exposing the revealed insulating film to the atmosphere of the mixed gas.

12. A method of manufacturing an electronic device, the method comprising:
a wiring formation step of forming wiring made of a first conductive material in a first insulating film that has been formed on a surface of a semiconductor substrate;
a second insulating film formation step of forming a second insulating film on the first insulating film so as to cover the wiring;
a photoresist layer formation step of forming a photoresist layer in a predetermined pattern on the formed second insulating film;
a plasma fabrication step of fabricating a connecting hole reaching the wiring in the second insulating film by plasma processing using the formed photoresist layer;
an ashing step of removing the photoresist layer;
a connecting hole filling step of forming a conductive film made of a second conductive material on the second insulating film so as to fill the connecting hole with the second conductive material;
a conductive film polishing step of polishing away the formed conductive film by chemical mechanical polishing;
a second insulating film exposure step of exposing the second insulating film, which has been revealed through the chemical mechanical polishing, to an atmosphere of a mixed gas containing ammonia and hydrogen fluoride under a predetermined pressure; and
a second insulating film heating step of heating to a predetermined temperature the second insulating film that has been exposed to the atmosphere of the mixed gas.

13. A method as claimed in claim 12, further comprising:
a connecting hole surface exposure step of exposing a surface of the fabricated connecting hole to an atmosphere of a mixed gas containing ammonia and hydrogen fluoride under a predetermined pressure; and
a connecting hole surface heating step of heating to a predetermined temperature the surface of the connecting hole that has been exposed to the atmosphere of the mixed gas.

14. A method as claimed in claim 13, further comprising:
a connecting hole coating step of coating the surface of the connecting hole that has been heated to the predetermined temperature with a conductive barrier.

15. A method of manufacturing an electronic device, the method comprising:
a wiring formation step of forming wiring made of a first conductive material in a first insulating film that has been formed on a surface of a semiconductor substrate;
a second insulating film formation step of forming a second insulating film on the first insulating film so as to cover the wiring;
a photoresist layer formation step of forming a photoresist layer in a predetermined pattern on the formed second insulating film;
a plasma fabrication step of fabricating a connecting hole reaching the wiring in the second insulating film by plasma processing using the formed photoresist layer;
a connecting hole filling step of forming a conductive film made of a second conductive material on the second insulating film so as to fill the connecting hole with the second conductive material;
a conductive film polishing step of polishing away the photoresist layer and the formed conductive film by chemical mechanical polishing;
a second insulating film exposure step of exposing the second insulating film, which has been revealed through the chemical mechanical polishing, to an atmosphere of a mixed gas containing ammonia and hydrogen fluoride under a predetermined pressure; and
a second insulating film heating step of heating to a predetermined temperature the second insulating film that has been exposed to the atmosphere of the mixed gas.

16. A computer readable medium including computer executable instructions, wherein the instructions, when executed by a processor, cause the processor to perform a method of processing a substrate having thereon an insulating film that has been revealed by chemical mechanical polishing, the method comprising:
an insulating film exposure step of exposing the revealed insulating film to an atmosphere of a mixed gas containing ammonia and hydrogen fluoride under a predetermined pressure; and
an insulating film heating step of heating to a predetermined temperature the insulating film that has been exposed to the atmosphere of the mixed gas.

17. A computer readable medium including computer executable instructions, wherein the instructions, when executed by a processor, cause the processor to perform a method of manufacturing an electronic device, the method comprising:
a wiring formation step of forming wiring made of a first conductive material in a first insulating film that has been formed on a surface of a semiconductor substrate;
a second insulating film formation step of forming a second insulating film on the first insulating film so as to cover the wiring;
a photoresist layer formation step of forming a photoresist layer in a predetermined pattern on the formed second insulating film;
a plasma fabrication step of fabricating a connecting hole reaching the wiring in the second insulating film by plasma processing using the formed photoresist layer;
an ashing step of removing the photoresist layer;
a connecting hole filling step of forming a conductive film made of a second conductive material on the second insulating film so as to fill the connecting hole with the second conductive material;
a conductive film polishing step of polishing away the formed conductive film by chemical mechanical polishing;
a second insulating film exposure step of exposing the second insulating film, which has been revealed through the chemical mechanical polishing, to an atmosphere of a mixed gas containing ammonia and hydrogen fluoride under a predetermined pressure; and a second insulating film heating step of heating to a predetermined temperature the second insulating film that has been exposed to the atmosphere of the mixed gas.

18. A computer readable medium including computer executable instructions, wherein the instructions, when executed by a processor, cause the processor to perform a method of manufacturing an electronic device, the method comprising:

a wiring formation step of forming wiring made of a first conductive material in a first insulating film that has been formed on a surface of a semiconductor substrate;

a second insulating film formation step of forming a second insulating film on the first insulating film so as to cover the wiring;

a photoresist layer formation step of forming a photoresist layer in a predetermined pattern on the formed second insulating film;

a plasma fabrication step of fabricating a connecting hole reaching the wiring in the second insulating film by plasma processing using the formed photoresist layer;

a connecting hole filling step of forming a conductive film made of a second conductive material on the second insulating film so as to fill the connecting hole with the second conductive material;

a conductive film polishing step of polishing away the photoresist layer and the formed conductive film by chemical mechanical polishing;

a second insulating film exposure step of exposing the second insulating film, which has been revealed through the chemical mechanical polishing, to an atmosphere of a mixed gas containing ammonia and hydrogen fluoride under a predetermined pressure; and a second insulating film heating step of heating to a predetermined temperature the second insulating film that has been exposed to the atmosphere of the mixed gas.

* * * * *